United States Patent
Osada et al.

(10) Patent No.: US 7,385,838 B2
(45) Date of Patent: *Jun. 10, 2008

(54) SEMICONDUCTOR DEVICE WITH A NON-ERASABLE MEMORY AND/OR A NONVOLATILE MEMORY

(75) Inventors: Kenichi Osada, Tokyo (JP); Riichiro Takemura, Tokyo (JP); Norikatsu Takaura, Tokyo (JP); Nozomu Matsuzaki, Kokubunji (JP); Takayuki Kawahara, Higashiyamato (JP)

(73) Assignee: Renesas Technology Corp., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/715,918

(22) Filed: Mar. 9, 2007

(65) Prior Publication Data

US 2007/0159871 A1    Jul. 12, 2007

Related U.S. Application Data

(63) Continuation of application No. 11/057,682, filed on Feb. 15, 2005, now Pat. No. 7,206,216.

(30) Foreign Application Priority Data

Feb. 20, 2004  (JP) ............................. 2004-043948
Jan. 7, 2005    (JP) ............................. 2005-001979

(51) Int. Cl.
  *G11C 11/00*    (2006.01)
(52) U.S. Cl. ............ 365/148; 365/189.01; 365/185.21; 365/203; 365/230.06
(58) Field of Classification Search ................ 365/148, 365/189.01, 185.21, 203, 230.03
See application file for complete search history.

(56) References Cited

U.S. PATENT DOCUMENTS 6,549,455 B2    4/2003    Yamada (Continued)

FOREIGN PATENT DOCUMENTS

JP    2003-100084    9/2001

OTHER PUBLICATIONS

A. Pirovano et al., "Electronic Switching Effect in Phase-Change Memory Cells", 2002 IEEE, 4 pages.

(Continued)

*Primary Examiner*—David Lam
(74) *Attorney, Agent, or Firm*—Reed Smith LLP; Stanley P. Fisher, Esq.; Juan Carlos A. Marquez, Esq.

(57) ABSTRACT

A semiconductor device comprises a plurality of memory cells, a central processing unit, a timer circuit which times a RESET time, and a timer circuit which times a SET time. A threshold voltage of an NMOS transistor of each memory cell is lower than that of the peripheral circuit, thereby easily executing a RESET operation. The direction of a flowing current is changed across the RESET operation and the SET operation, and the bit lines are activated at high speed, thus preventing system malfunctions. Further, the semiconductor device can overcome such problems as a wrong write operation and data destruction, resulting from the variation in the CMOS transistors when operating phase change elements with minimum size CMOS transistors at a core voltage (e.g. 1.2 V). According to the present invention, stable operations can be realized at a low voltage, using minimum-size cell transistors.

12 Claims, 31 Drawing Sheets

U.S. PATENT DOCUMENTS

| | | | |
|---|---|---|---|
| 6,707,712 | B2 | 3/2004 | Lowery |
| 6,903,982 | B2 * | 6/2005 | Ma et al. ............... 365/189.01 |
| 6,914,797 | B2 * | 7/2005 | Ashizawa et al. .......... 365/145 |
| 6,937,505 | B2 | 8/2005 | Morikawa |
| 7,064,970 | B2 | 6/2006 | Nazarian |
| 7,145,791 | B2 * | 12/2006 | Tsushima et al. ........... 365/148 |
| 7,154,788 | B2 * | 12/2006 | Takemura et al. ..... 365/189.05 |
| 7,206,216 | B2 * | 4/2007 | Osada et al. ................ 365/148 |

OTHER PUBLICATIONS

Manzur Gill et al., "Ovonic Unified Memory—A High-Performance Nonvolatile Memory Technology for Stand-Alone Memory and Embedded Applications", 2002 IEEE International Solid-State Circuits Conference, 2 pages.

Y. N. Hwang et al., "Completely CMOS-Compatible Phase-Change Nonvolatile RAM Using NMOS Cell Transistors", 2 pages.

* cited by examiner

SEMICONDUCTOR DEVICE WITH A NON-ERASABLE MEMORY AND/OR A NONVOLATILE MEMORY

CROSS-REFERENCES TO RELATED APPLICATIONS

This application is a Continuation of U.S. application Ser. No. 11/057,682 filed on Feb. 15, 2005 now U.S. Pat. No. 7,206,216. Priority is claimed based on U.S. application Ser. No. 11/057,682 filed on Feb. 15, 2005, now U.S. Pat. No. 7,206,216, which claims the priority date of Japanese Patent Application No. 2004-43948 filed on Feb. 20, 2004 and Japanese Patent Application No. 2005-001979 filed on Jan. 7, 2005, the entire disclosure of which is incorporated herein by reference.

FIELD OF THE INVENTION

The present invention relates to a semiconductor device and a semiconductor memory device, and more particularly to a system LSI (a microcomputer) having a hybrid mounting approach with a non-erasable memory and/or a nonvolatile memory.

BACKGROUND OF THE INVENTION

To achieve a high-integrated nonvolatile memory operable at high speed, a phase change memory has continuously been developed. Such a phase change memory is described in Non-patent documents 1, 2, and 3 and Patent document 1. For example, the phase change memory of Non-patent document 1 stores information, by taking advantage of a characteristic that the resistance of a phase change material (a chalcogenide material) is changed in accordance with its state. An operation for writing the resistance of the phase change material is achieved when the state of the material is altered by heat of a current flowing thereto. To set a high resistance value (the memory is made amorphous), so-called a RESET operation, the memory is maintained at a relatively high temperature. To set a low resistance value (the memory is made crystallized), so-called a SET operation, the memory is maintained at a relatively low temperature for a sufficient period of time. For the phase change material, an operation for reading is executed by controlling a current to flow in such a range that the resistance of phase change material does not change.

Non-patent document 2 and Patent document 1 disclose the characteristic of the phase change resistance. Non-patent document 3 discloses a memory cell comprising the phase change resistance and an NMOS transistor.

Such documents disclose not only a high speed ROM (Read-Only Memory), but also the possibility of a nonvolatile RAM (Random Access Memory), and mention also realization of an integrated memory having both systems of ROM and RAM. In the phase change memory, if an electrode area is small in the phase change element, the phase of the element can be changed at a low voltage, thus easily realizing the scaling. Because the phase change resistance greatly changes, a read operation can be performed at a high speed. For these reasons, it is hoped that the high-speed nonvolatile memory will be realized using the phase change memory.

[Non-patent document 1] 2002 IEEE International Solid-State Circuits Conference, Digest of Technical Papers, pp. 202-203.

[Non-patent document 2] 2002 IEEE International Electron Devices Meeting, Technical Digest, pp. 923-926.

[Non-patent document 3] 2003 Non-Volatile Semiconductor Memory Workshop, Digest of Technical Papers, pp. 91-92.

[Patent document 1] JP-A No. 100084/2003

SUMMARY OF THE INVENTION

To accomplish the present invention, inventors of the present invention have examined the use of the phase change element embedded into a microcomputer. The inventors have considered to adopt a MOS transistor of a minimum process size (which is used in the central processing unit of the microcomputer) for a phase change memory block so as to have a small area of the phase change memory block, in the case where the phase change element is embedded into the microcomputer. However, the MOS transistor of a minimum process size needs a core voltage (e.g. 1.2 V) used in the central processing unit, etc. This is because the MOS transistor may fearfully be destroyed due to the withstand voltage thereof, if a voltage greater than the core voltage is supplied thereto. It is found that if a MOS transistor of the central processing unit is used, approximately only a 40 micro-amps of current flows thereinto, and the RESET operation requiring a relatively high current can hardly be operated. To increase a voltage to be applied to the phase change element, if using a MOS transistor of a high withstand voltage which is used in an input/output circuit, etc., the area is undesirably enlarged.

A lower current needs to flow in the SET operation than the current in the RESET operation, and also needs to flow in the read operation than in the SET operation. A large current variation occurs in the MOS transistors of a minimum process size that is used in the central processing unit, etc. For this reason, it is difficult to control a voltage is so applied that their operational currents do not overlap. Therefore, problems are a wrong write operation, in which data is RESET in the SET operation, and destruction of data in the read operation.

As explained above, in the phase change memory block, information is stored by changing a resistance value of the phase change element in accordance with a value of a current flowing thereto. However, it is difficult to obtain a large current in the case where the MOS transistor of the microcomputer is used in the memory block having the phase change element, and it is also difficult to perform the RESET operation requiring a relatively large current. Because a current variation occurs in the MOS transistors, it is necessary to secure great margin between a current flowing to the phase change element in the SET operation and a current flowing to the phase change element in the RESET operation.

The below briefly describes a typical summary of those inventions disclosed in this specification.

According to the first aspect of the present invention, a semiconductor device comprises memory cells and an input/output circuit. In a MOS transistor used in the memory cell, the absolute value of a threshold voltage is lower than that of a MOS transistor included in the input/output circuit. Further, the absolute value of a threshold voltage of the MOS transistor in the memory cell is preferably lower than that of a MOS transistor used in a central processing unit.

According to the second aspect of the present invention, a semiconductor device includes source lines connected to the memory cell along the same direction as that of word lines, and includes also a source driver circuit corresponding to the source lines. Further, a potential of the source lines is preferably greater than the source potential in a read operation.

According to the third aspect of the present invention, a direction of a current flowing to the source line and the bit line is changed across a SET operation and a RESET operation for the memory cell storing the information.

According to the fourth aspect of the present invention, a negative voltage is supplied to the word lines connected to the memory cell, in a standby state.

According to the fifth aspect of the present invention, a voltage lower than a voltage supplied in a write operation is supplied to the bit line in a read operation for the memory cell.

According to the sixth aspect of the present invention, a semiconductor device comprises source lines connected to a memory cell along the same direction as that of word lines. In the semiconductor device, the number of memory cells connected to one source line is greater than the number of memory cells connected to one bit line.

According to the seventh aspect of the present invention, a semiconductor device includes a global bit line which is connected to a plurality of bit lines.

According to the eighth aspect of the present invention, the configuration of each of the above-described first to seventh inventions may arbitrarily be combined with each other.

DETAILED DESCRIPTION OF THE PREFERRED EMBODIMENTS

Figure 1:
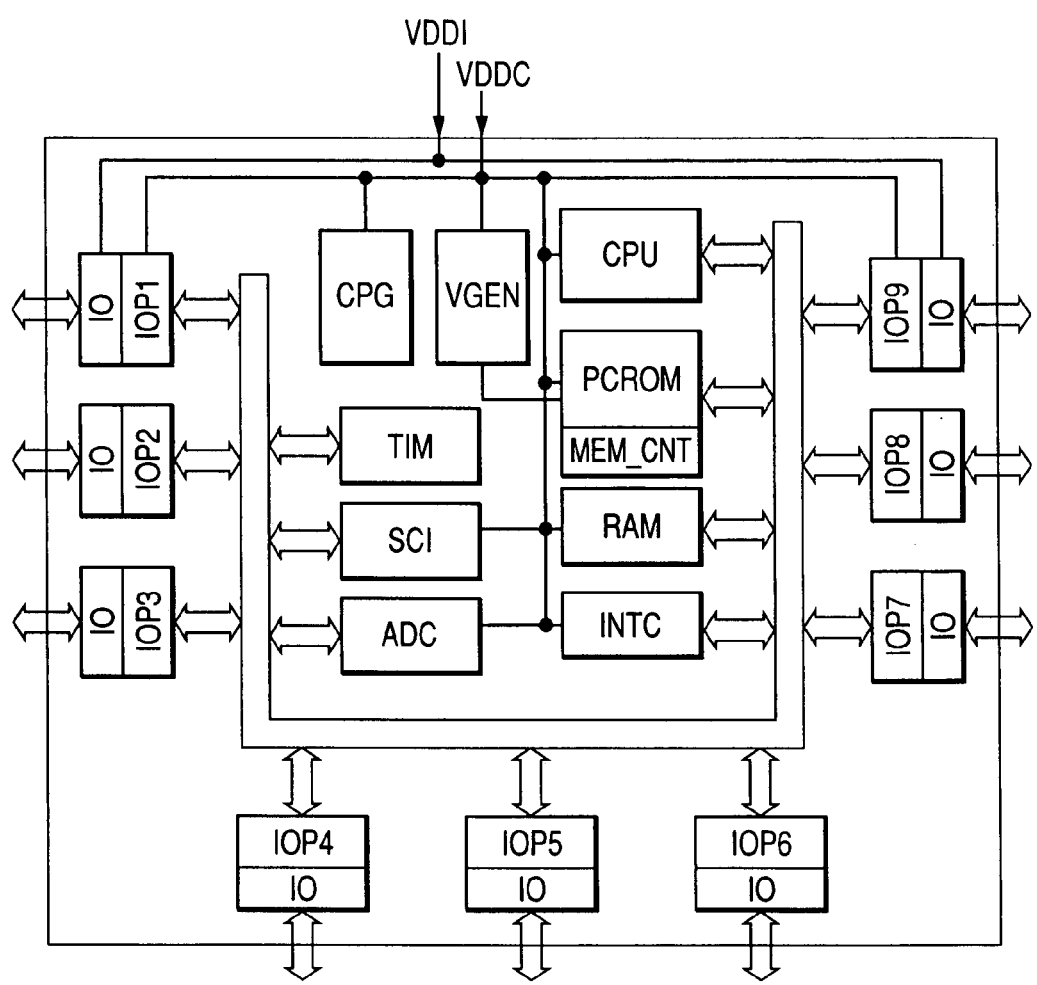
FIG. 1 is a block diagram showing a microcomputer according to the present invention.

Preferred embodiments of a semiconductor memory device according to the present invention will hereinafter be described with reference to the drawings. In each of the embodiments, though there is particular no limit to the configuration, those circuitry elements of each functional block are formed on a single semiconductor substrate (with a material such as single crystal silicon, etc.), using an integrated circuit technology of well-know CMOS (complementary MOS) transistors or the like. In the drawings of the MOS transistors, the connection to the substrate potential is not particularly shown. As long as the MOS transistors are properly operable, their connection system is not particularly restricted. Unless otherwise indicated, "L" denotes a low level of a signal, while "H" denotes a high level of a signal.

FIG. 1 is a diagram showing an example of a single-chip microcomputer according to the present invention. Although though is no particular limit to the configuration, the single-chip microcomputer includes a CPU (Central Processing Unit), an interrupt control circuit INTC, a 4 MB memory block PCROM with phase change elements, a 1 KB internal memory RAM, a timer TIM, a serial communication interface SCI, an A/D converter ADC, a first to ninth input/output ports IOP1 to IOP9, and a clock pulse generator CPG. The single-chip microcomputer is formed on a single semiconductor substrate using a well-know semiconductor fabrication technology.

The CPU, the interrupt control circuit INTC, the 4 MB phase change memory PCROM, the 1 KB internal memory RAM, the timer TIM, the silicon communication interface SCI, the A/D converter ADC and the first to ninth input/output ports IOP1 to IOP9 are mutually connected through an internal bus 1000. In the microcomputer, read/write operations are executed under the control of the CPU. The internal bus 1000 includes an address bus, a data bus, and lines for a read signal, a write signal, a functional block selection signal, and a system clock, etc. The system clock is appropriately generated by the clock pulse generator CPG, based on a signal of a non-illustrative crystal oscillator. An external clock may be input as a system clock without using the crystal oscillator. A voltage generator circuit VGEN receives an external voltage VDDC (e.g. 1.2 V), and supplies the phase change memory PCROM with a voltage therefor. In this embodiment, the external voltage includes VDDC and VDDI (e.g. 3.3 V). The voltage VDDC is supplied to the circuitry block of the CPU, while the voltage VDDU is supplied to the input/output circuits IO. In the case where only one kind of voltage is externally supplied, a voltage generated by the voltage generator circuit VGEN may be supplied to the circuitry block of the CPU, etc.

The interrupt control circuit INTC controls an interrupt request signal sent from the timer TIM, the serial communication interface SCI, the A/D converter 730 or the like, and requests the CPU for interruption. The input/output ports IOP1 to IOP9 serve also as an address buss output, a data bus input/output, a bus control signal input/output, an interrupt request signal input, etc. Such a system as to whether the ports IOP1 to IOP9 serve as any of the above outputs, input/outputs, and input, is determined based on an operational mode and the software. Each of the input/output ports IOP1 to IOP9 is connected to an external terminal through an input/output circuit IO. The input/output circuit IO accepts a high voltage that is greater than a voltage supplied to an input circuit, such as the CPU, etc.

Figure 2:
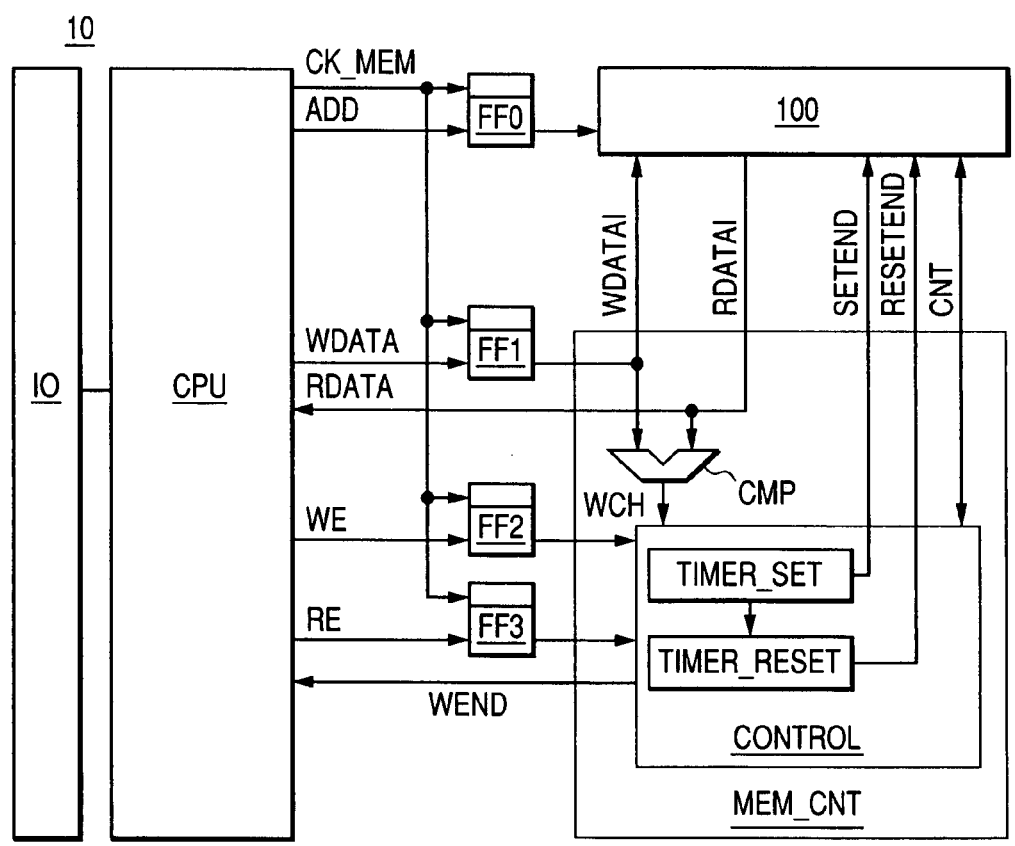
FIG. 2 is a schematic diagram showing the essential part of the microcomputer of FIG. 1.

FIG. 2 is a schematic diagram showing the essential part of the above-described single-chip microcomputer, for explaining the present invention. In FIG. 2, the microcomputer includes a memory block 100 with phase change elements, a memory controller MEM_CNT controlling the memory block 100, latch circuits (FF0, FF1, FF2, FF3), the CPU, and the input/output circuit IO.

The memory block 100 will specifically be described later. The memory controller MEM_CNT includes a control circuit CONTROL and a comparator circuit CMP, used for checking whether or not write data has desirably been written. The control circuit CONTROL includes a timer circuit TIMER_SET and another timer circuit TIMER_RESET. The timer circuit TIMER_SET times the time of a SET operation (i.e. WRITE operation) in which the resistance of each memory cell is decreased. The timer circuit TIMER_RESET times the time of a RESET operation in which the resistance of each memory cell is increased. The memory controller MEM_CNT receives write data WDATA, a write enable signal WE, and a read enable signal RE. The memory controller MEM_CNT generates write data WDATAI and a control signal CNT so as to control the memory block 100. The timer circuit TIMER_SET outputs a control signal SETEND for ending the SET operation to the memory block 100, while the timer circuit TIMER_RESET outputs a control signal RESETEND for ending the RESET operation thereto. The comparator circuit CMP compares data RDATAI read out from the memory block 100 with the write data WDATAI, and outputs a comparison result WCH. Each of the latch circuits (FF0, FF1, FF2, FF3) accepts an input clock CK_MEM for memory, generated by the clock generator circuit CPG shown in FIG. 1.

Figure 3:
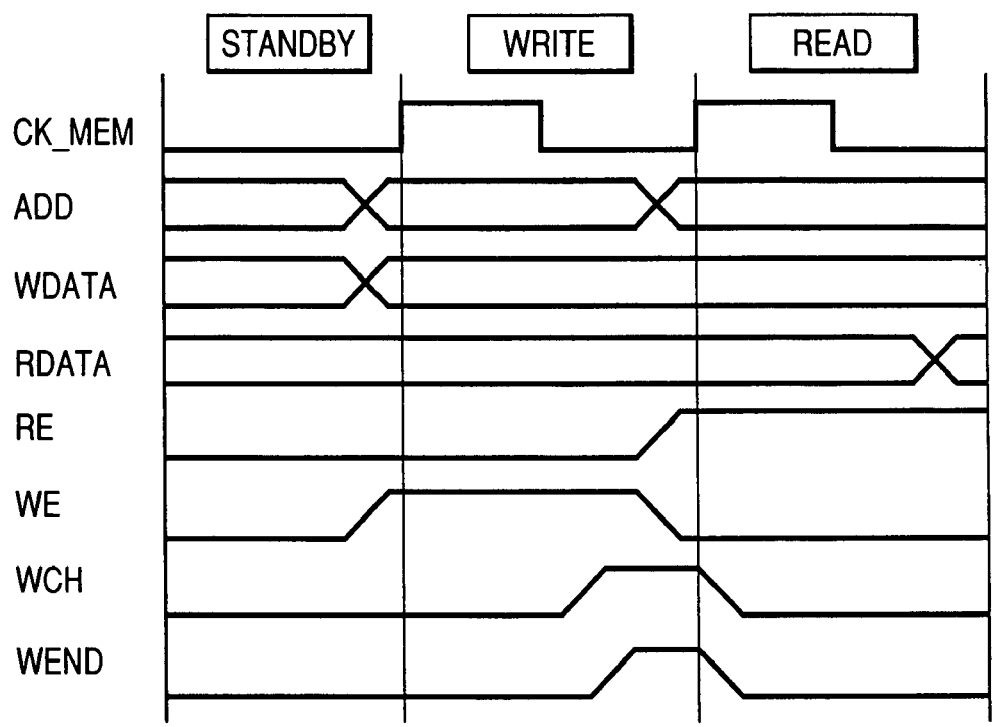
FIG. 3 is an operational waveform diagram for the essential part of the microcomputer shown in FIG. 2.

FIG. 3 is a diagram for explaining operations of the microcomputer shown in FIG. 2. Signals are initially in a STANDBY mode as shown in the first section in FIG. 3. The CPU writes data during the cycle WRITE afterwards. The CPU gives the latch circuits (FF0, FF1, FF2) an address ADD, write data WDATA, and a write enable signal WE. When the clock CK_MEM for memory shifts from "L" to "H", the address ADD is input to the memory block 100, while the write data WDATA and the write enable signal WE are input to the memory controller MEM_CNT. The memory controller MEM_CNT generates write data WDATAI and a control signal CNT, and sends them to the memory block 100. As a result of this, a write operation begins in the memory block 100. According to the present invention, the cycle WRITE is separated into a set cycle and a reset cycle. When the SET operation begins, and the timer circuit TIMER_SET times the SET time. Upon the elapse of a predetermined time period, a SET operation end signal SETEND is sent to the memory block 100. Then, the memory block 100 ends the SET operation, and begins a RESET operation. At the same time, the timer circuit TIMER_RESET begins timing the RESET time, and sends a RESET operation end signal RESETEND to the memory block 100, upon the elapse of a predetermined time period. As a result of this, the RESET operation is ended in the memory block 100. Thereafter, a VERIFY operation for checking whether or not the data has satisfactorily been written is executed, as needed. In the verify operation, the written data is read from the memory block 100, and controls the comparator circuit CMP to compare the read data RDATAI with the written data WDATAI. In the case where the compared data are the same, the WCH shifts from "L" to "H", representing that the data has satisfactorily been written. In the case where the compared data are not the same, the write operation is performed again. Then, if the data has satisfactorily been written, the memory controller MEM_CNT sends a write end signal WEND back to the CPU. Note that the verify operation can be excluded, and if excluded, the comparator circuit CMP is not necessary.

In the cycle READ, data is read out. The CPU gives the latch circuits (FF0, FF3) an address ADD and a read enable signal RE. If the clock CK_MEM for memory shifts from "L" to "H", the address ADD is input to the memory block 100, while the read enable signal RE is input to the memory controller MEM_CNT. The memory controller MEM_CNT generates a control signal CNT, and sends the generated signal to the memory block 100, thereby beginning a read operation in the memory block 100. The read data RDATAI is sent to the CPU through the memory controller MEM_CNT, completing the read operation. Needless to say, it is not necessary that the WRITE operation and the READ operation be successively executed.

Figure 4:
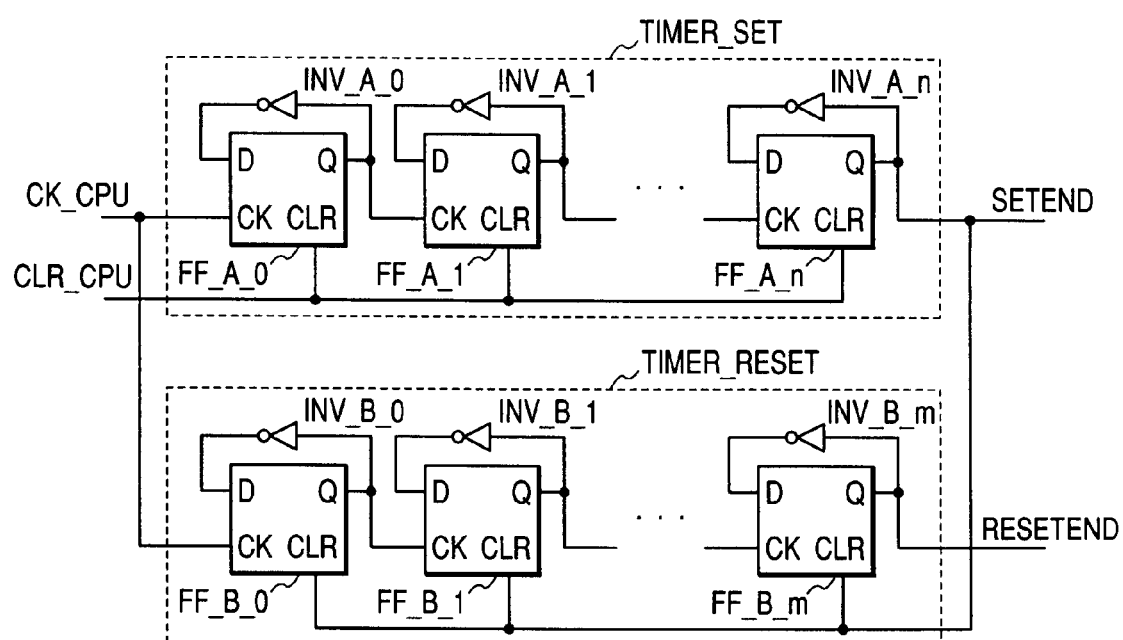
FIG. 4 is a circuitry block diagram of a timer circuit shown in FIG. 2.

FIG. 4 shows the specific configuration of each of the timer circuits TIMER_SET and TIMER_RESET shown in FIG. 1. The timer circuit TIMER_SET includes an "n" number of flip flop circuits FF_A connected in series. The timer circuit TIMER_RESET includes an "m" number of flip flop circuits FF_B connected in series. In the flip flop circuit FF, an "L" level signal is output to an output terminal Q, in the case where a clear signal terminal CLR is "L". In the case where the clear signal terminal CLR is "H", a value of an input terminal D is output to the output terminal Q, if a clock terminal CK shifts from "L" to "H". In each of the flip flop circuits FF, the output terminal Q is connected to the input terminal D through an inverter circuit INV. A base clock signal CK_CPU is input from the CPU both to the first flip flop circuit FF_A_0 of the timer circuit TIMER_SET and to the clock terminal CK of the first flip flop circuit FF_B_0 of the timer circuit TIMER_RESET. In the rest of the flip flop circuits FF, the clock terminal CK is connected to the output terminal Q of the front stage flip flop circuit. The clear signal CLR_CPU is input to the clear signal terminal CLR of the flip flop circuits FF_A of the timer circuits TIMER_SET. The control signal SETEND is the output of the final stage flip flop circuit FF_A_n of the timer circuit TIMER_SET. The control signal RESETEND is the output of the final stage flip flop circuit FF_B_m of the timer circuit TIMER_RESET. The control signal SETEND is input to the clear signal terminal CLR of the flip flop circuits FF_B of the timer circuit TIMER_RESET.

Before the timer operates, the clear signal CLR_CPU is "L". If the clear signal CLR_CPU becomes "H", the timer circuit TIMER_SET begins timing the SET time. If the base clock signal CK_CPU shifts 2n−1 times, the control signal SETEND shifts from "L" to "H", and the timer circuit TIMER_SET outputs the SET end time. It is therefore necessary to set in advance the value of "n" so that a desired SET time can be realized. If the control signal SETEND shifts from "L" to "H", the timer circuit TIMER_RESET begins timing the RESET time. If the base clock signal CK_CPU shifts 2m−1 times, the control signal RESETEND shifts from "L" to "H", and then timer circuit TIMER_RESET outputs the RESET end time. It is therefore necessary to set in advance the value of "m" so that a desired RESET time can be realized.

As described above, a current flows to the memory device at different timings between the SET and RESET operations in accordance with the timers, resulting in avoiding system malfunctions.

(Threshold Value of MOS Transistor in Memory Cell)

Figure 5:
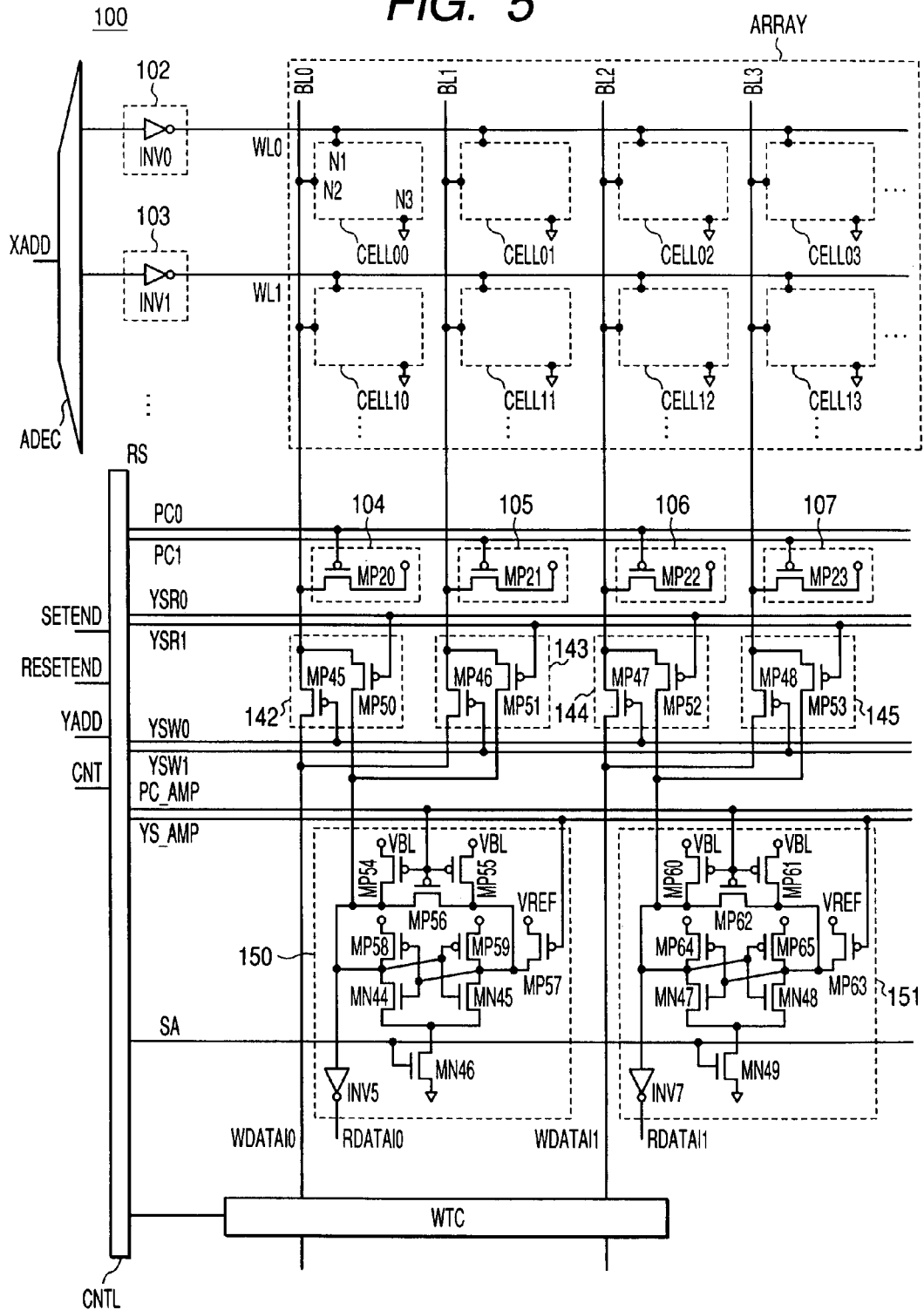
FIG. 5 is a circuitry diagram showing an embodiment of a memory block shown in FIG. 2.
Figure 6A:
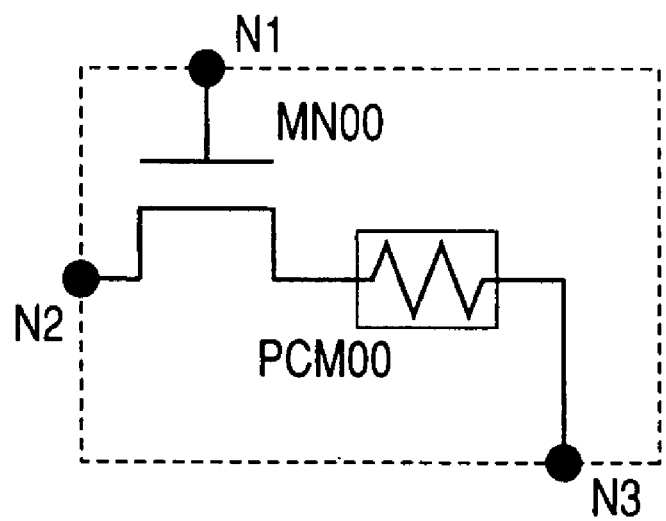
FIG. 6A is a circuitry diagram showing a memory cell used in the memory block of FIG. 2.
Figure 6B:
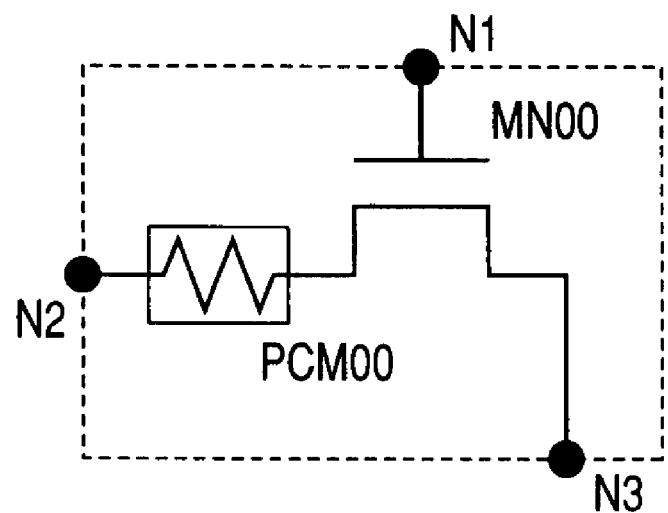
FIG. 6B is a circuitry diagram showing a memory cell used in the memory block of FIG. 2.

FIG. 5 is a diagram for specifically explaining the configuration of the memory block 100. A memory array ARRAY includes a plurality of word lines WL and a plurality of bit lines BL. Memory cells CELL are provided at the respective intersections of the word lines WL and the bit lines BL. As shown in a memory cell CELL00 by example, a node N1 is connected to a word line, a node N2 is connected to a bit line, and a node N3 is connected to a ground potential. Each of the memory cells CELL is shown in FIGS. 6A and 6B in detail. Each memory cell is comprised of an N-channel MOS transistor MN00 and a memory device PCM00. The memory device PCM00 is a so-called phase change element, for example. Such a device has a low resistance approximately in a range from 1 KΩ to 10 KΩ in a crystal state, and has a high resistance of 100 KΩ or higher in an amorphous state. The memory device PCM00 can be changed in its state, in accordance with the temperature of heat applied thereto. In particular, the memory device is in an amorphous state upon application of a high temperature of heat, while the device is in a crystal state upon application of a low temperature of heat. In addition, whether the memory device PCM00 is in an amorphous state or crystal state is depended upon the value of current flowing thereto and the time the current flows thereto. The memory device PCM00 includes a phase change material, such as a so-called chalcogenide material, though there is no particular limit to the material. The chalcogenide material may, for example, be GeSbTe (germanium-antimony-tellurium) or ZnTe (zinc-tellurium), etc. A word line WL0 is connected to the gate electrode of the N-channel MOS transistor MN00 through the node N1. The word line WL0 is so controlled that the N-channel MOS transistor MN00 is set ON in a selected state and is set OFF in a non-selected state. The memory cell included in this embodiment reads out information in accordance with the resistance value of the memory device PCM00, (i.e. in accordance with the value of the current flowing to the bit and source lines). One end of the phase change element PCM00 can be connected to the ground potential through the node N3 as shown in FIG. 6A, or can be connected to the bit line through the node N2 as shown in FIG. 6B. With the memory cell of FIG. 6B, the source electrode of the N-channel MOS transistor is connected directly to the ground potential. As a result, the voltage of the gate and source electrodes becomes high, thereby obtaining a current relatively greater than that of the memory cell of FIG. 6A. In this specification, unless otherwise indicated, the memory cell of FIG. 6A is employed by way of example.

Word driver circuits (102, 103) are connected to the respective word lines WL. The word driver circuit 102 includes, for example, an inverter circuit INV0, and selects one word line WL based on data of a decoder circuit ADEC.

Precharge circuits (104, 105, 106, 107) are connected to the respective bit lines BL. In particular, the precharge circuit 104 includes, for example, a P-channel MOS transistor MP20. In this circuit, the drain electrode is connected to the bit line BL0, the gate electrode is connected to a control signal line PC0, and the source electrode is connected to a source potential line. The precharge circuits (104, 105, 106, 107) are alternately connected to the control signal lines PC0 and PC1. That is, a non-selected memory cell should always be adjacent to a memory cell being active for a read or write operation. Those alternate memory cells generate heat. This prevents that the heat is generated only from a limited part of the semiconductor integrated circuit, and can improve stable operations of the circuit.

The bit lines are connected further to a read/write circuit. The read/write circuit comprises, for example, a write circuit WTC writing data to the bit lines BL0 and BL1, a sense amplifier circuit 150 reading data from the bit line BL0, and a sense amplifier circuit 151 reading data from the bit line BL1. The write/read circuit outputs read data RDATAI0, and receives write data WDATAI0 input thereto.

A control circuit CNTL receives control signals (SETEND, RESETEND, YADD, CNT) from the memory controller MEM_CNT, generates and outputs control signals (RS, PC, YSW, YSR).

Figure 7:
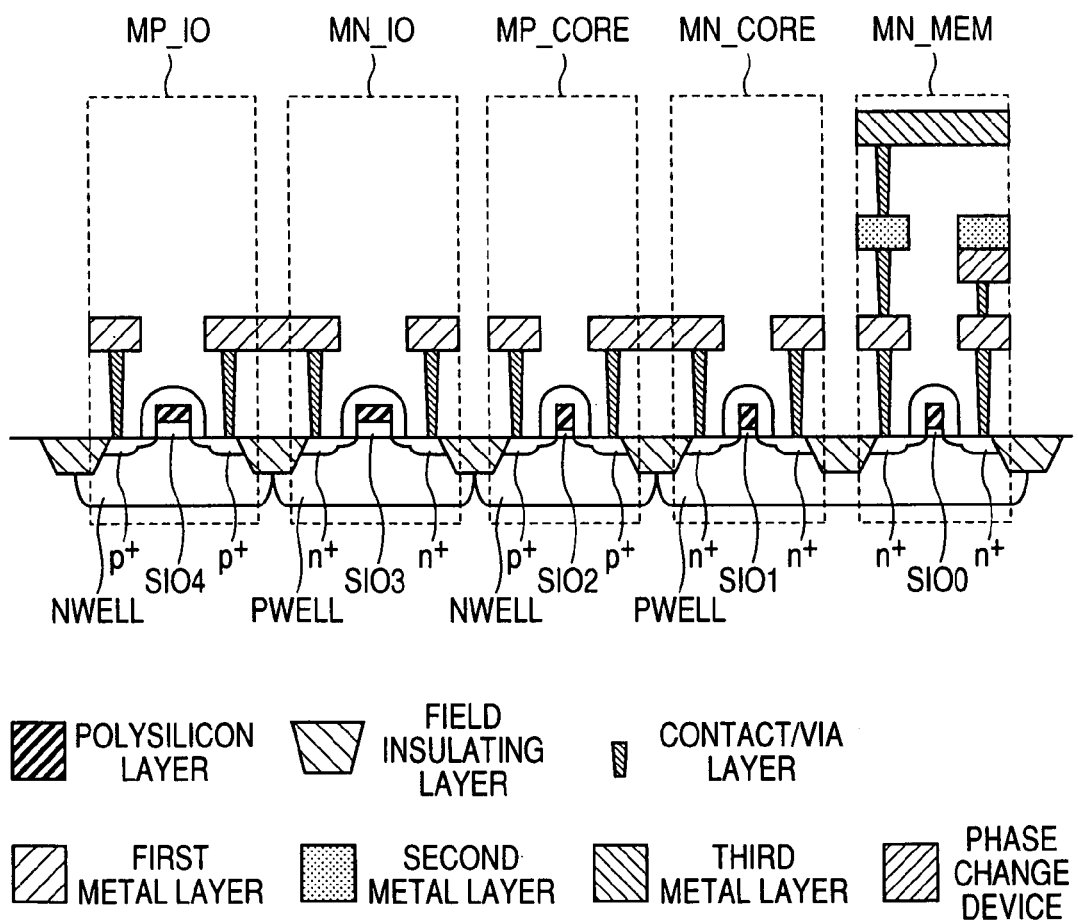
FIG. 7 is a cross-sectional schematic diagram showing an example of the microcomputer shown in FIG. 1.

FIG. 7 shows a cross sectional view of the semiconductor integrated circuit according to the present invention. The semiconductor integrated circuit of FIG. 7 includes an N-channel MOS transistor MN_MEM_LVT, an N-channel MOS transistor MN_CORE, a P-channel MOS transistor MP_CORE, an N-channel MOS transistor MN_IO, and a P-channel MOS transistor MP_IO. The N-channel MOS transistor MN_MEM_LVT is used in the memory cell CELL. The N-channel MOS transistor MN_CORE is used in a core circuit, such as a peripheral circuit of the memory, the CPU, the latch circuit FF, etc. The N-channel MOS transistor MN_IO and the P-channel MOS transistor MP_IO are used in the input/output circuit IO or the like. Gate oxide films (SI00, SI01, SI02) are used in the transistors of the memory cells CELL or the core circuits, and are made to have the same thickness. In particular, these gate oxide films are thinner than gate oxide films (SI03, SI0) of the transistor of the input/output circuit IO. The gate oxide films (SI00, SI01, SI02) have the equal longitudinal length (channel length) that is shorter than the longitudinal length of the gate oxide films (SI03, SI04) in the transistor of the input/output circuit IO. A high voltage (e.g. 3.3 V) is supplied between the source and drain of the N-channel MOS transistor MN_IO and P-channel MOS transistor MP_IO which are used in the input/output circuit 10. A low voltage (e.g. 1.2 V at maximum) is supplied between the source and drain of the N-channel MOS transistor MN_MEM_LVT, N-channel MOS transistor MN_CORE, and P-channel MOS transistor MP_CORE. Note that the low voltage to be supplied, in this case, is lower than the voltage supplied to the input/output circuit IO. The N-channel MOS transistor MN_MEM_LVT is used in the memory cell CELL. The N-channel MOS transistor is used in the core circuits, such as the peripheral circuit of the memory, the CPU, the latch circuit FF.

In this embodiment, in each transistor MN of the memory cells CELL, a threshold voltage is lower than that of the MOS transistor of the input/output circuit IO. A high voltage is supplied to the MOS transistor of the input/output circuit IO. To restrain the leakage current, a MOS transistor having a relatively high voltage threshold (approximately 0.7 V) is used. On the contrary, in the case where a phase change element is used, a sufficient current needs to be obtained. Thus, the MOS transistor should have a threshold voltage (e.g. 0.5 V) that is lower than that of the MOS transistor of the input/output circuit. As a result, a relatively large current can be obtained, as compared to the case where the MOS transistor whose threshold voltage is equal to that of the input/output circuit IO is used. Hence, a SET operation can satisfactorily be executed. Because a high current value can be obtained, it is easy to discriminate the current for the SET operation, the RESET operation, and the READ operation. If such a MOS transistor is used, the transistor is set to have a threshold voltage that is equal to the threshold voltage of the MOS transistor MN_CORE (used for the CPU, etc.) and MP_CORE. As a result, addition masks may not be needed, and it is possible to reduce the costs for manufacturing the semiconductor devices (e.g. the microcomputer, etc.).

In this embodiment, the memory device stores information in accordance with its state (crystal/amorphous state or the resistance value). Even if the threshold voltage of the transistor MN is decreased, stored information will not be destroyed, unlike the DRAM which stores information in accordance with the amount of electric charges stored in the capacitor.

Figure 8:
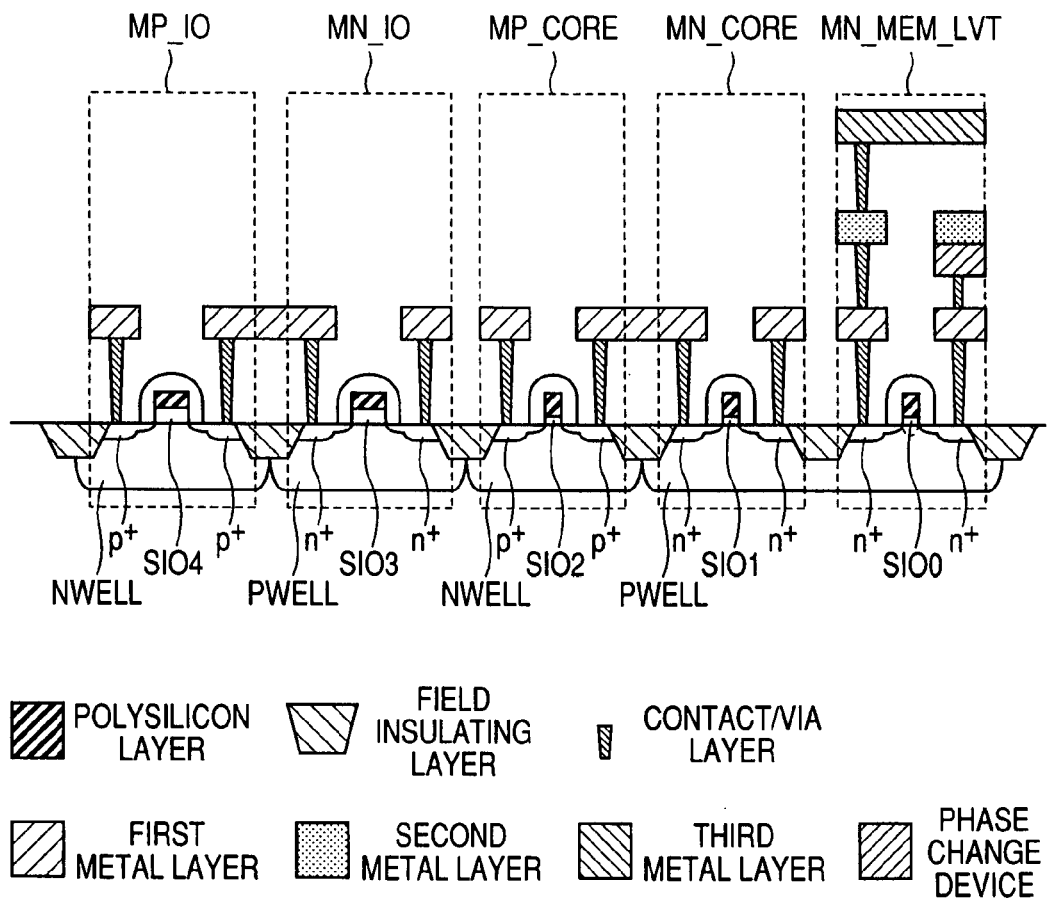
FIG. 8 is a cross-sectional schematic diagram showing another example of the microcomputer shown in FIG. 1.

FIG. 8 exemplarily shows another cross sectional view of the microcomputer shown in FIG. 1. Unlike the device of FIG. 7, in the CPU and the memory cells which receive the same maximum voltage supplied thereto in the device of FIG. 8, the absolute value of the threshold voltage of the transistor N-channel MOS transistor MN_MEM_LVT is set lower (e.g. 0.2 V to 0 V) than the absolute value of the N-channel MOS transistor MN_CORE, and P-channel MOS transistor MP_CORE. The P-channel MOS transistor and the P-channel MOS transistor MP_CORE are used in the core circuit, such as the peripheral circuit of the memory, the CPU, or latch circuits FF. As a result, a much greater current can be obtained, thereby preventing an increase in the area of the circuit. This enables to obtain a high current required for the SET operation, and enables embedding of the memory in the microcomputer, etc. Because a high current can be obtained, the margin of the SET operation and the RESET operation can be obtained, thus realizing stable operations of the phase change memory.

Figure 29A:
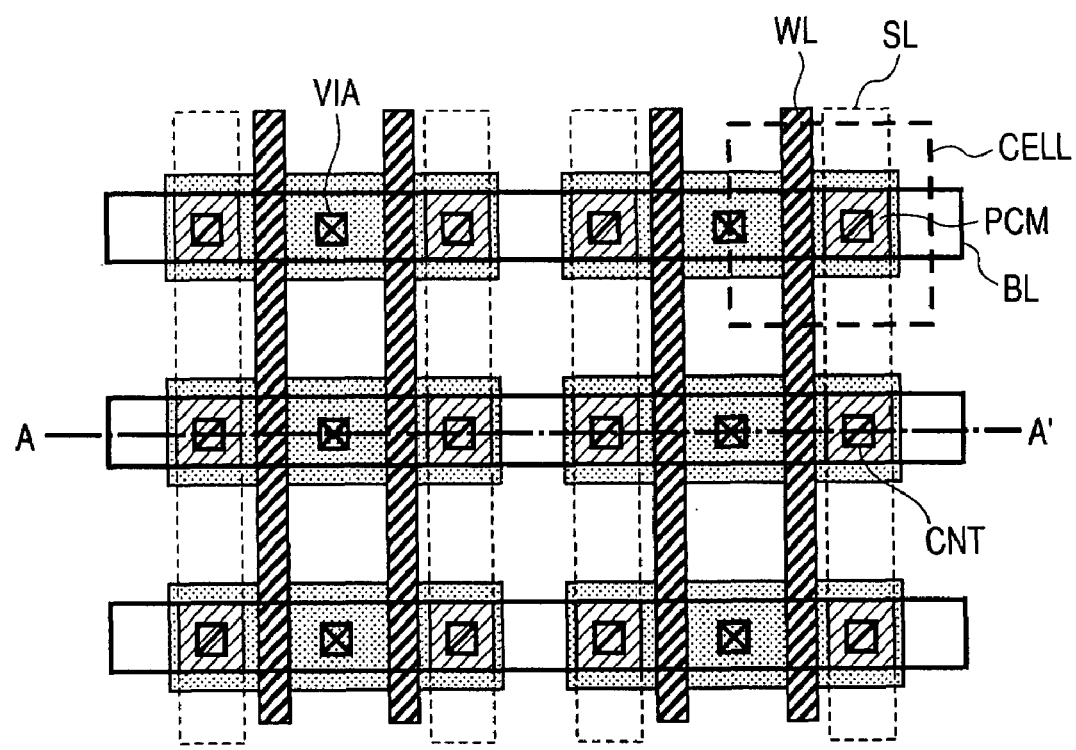
FIG. 29A is a plan view of the memory array shown in FIG. 5.
Figure 29B:
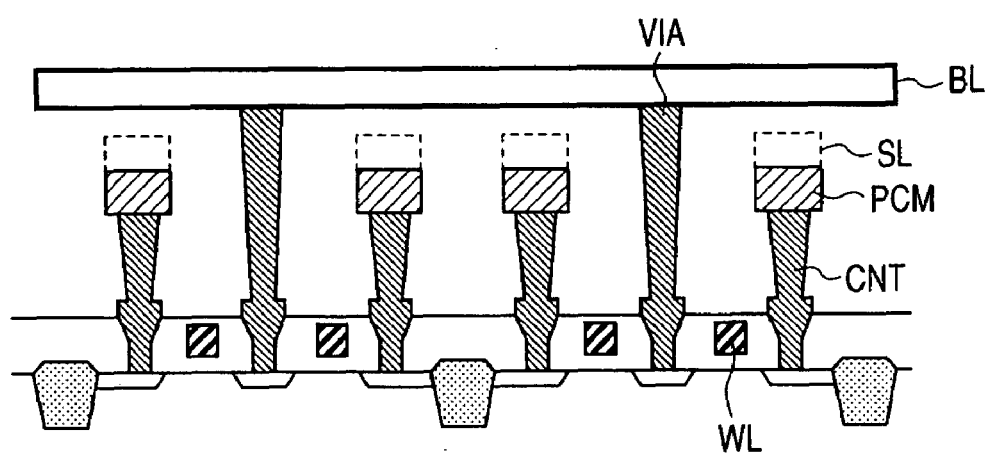
FIG. 29B is a cross sectional view of the memory array shown in FIG. 5.

FIG. 29A is a plan view of the memory array ARRAY shown in FIG. 5, and FIG. 29B is a cross-sectional view of the memory array ARRAY show in FIG. 5. In this embodiment, the phase change element PCM is essentially included in each memory cell. The word lines WL and the source lines SL are provided along the same direction, while the bit lines BL are provided along a direction facing the direction of the word lines WL and the source lines SL. The selected transistor and the phase change element PCM are connected with each other through a contact CNTC, and the selected transistor and the bit lines are connected through a via VIA. In this case, the size of the contact CNTC in plan is smaller than the size of the phase change element PCM. That is, the area of the contact CNTC in contact with the phase change element PCM is smaller than the area of the phase change element PCM. As a result, the current is concentrated, thus efficiently executing the write operation for the phase change element.

Figure 9:
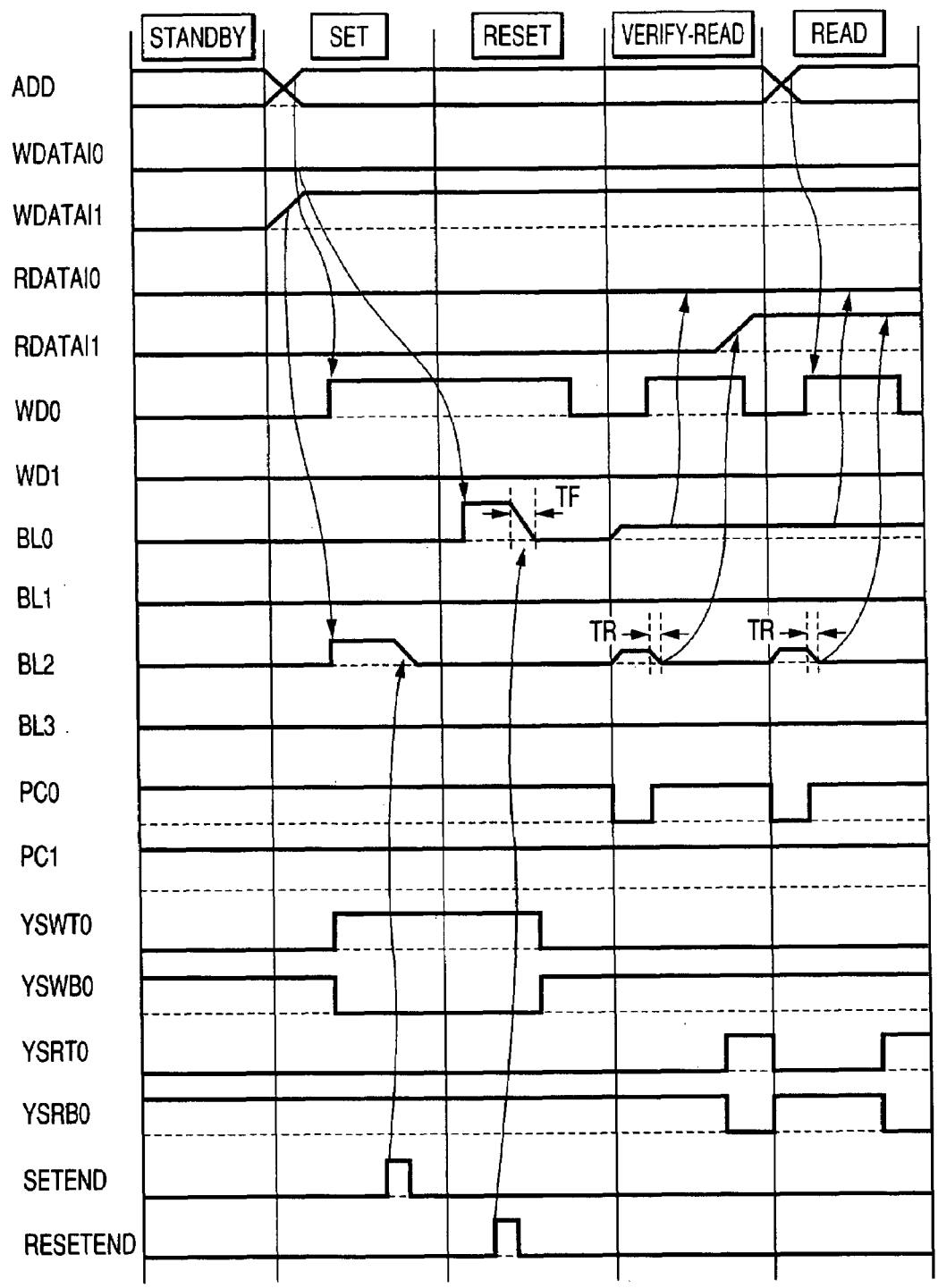
FIG. 9 is an operational waveform diagram for the memory block shown in FIG. 5.

FIG. 9 is a diagram for specifically explaining operations of the memory block. Signals are initially in a STANDBY mode, as shown in the first section of FIG. 9. A write operation is executed in the memory block, and includes three steps of a SET operation, a RESET operation, and a VERIFY-READ operation. The SET operation is executed for crystallizing the device so as to decrease the resistance. The RESET operation is executed for controlling the device to be made amorphous. The VERIFY-READ operation is executed for checking whether data has satisfactorily been written. If the SET operation begins, the address ADD and the write data WDATAI are input. The address, ADD includes an X-system address input to the decoder circuit ADEC and a Y-system address YADD input to the control circuit CNTL. The X-system address is decoded by the decoder circuit ADEC, and a selected word line WD shifts from "L" to "H". In this embodiment, the selected word line is the word line WD0. The Y-system address is decoded by the control circuit CNTL and output as signals (YSW, YSR) for selecting a corresponding column. The write data WDATAI is controlled in accordance with control signals (YSWT, YSWB) and are input selectively to the bit lines BT. In this embodiment, the control signals (YSWT0, YSWB0) are active, and thus the write data WDATAI1 is input to a bit line BL2, thereby activating bit line. In this case, a writing potential is set as a first potential lower than the source potential. The above processing is thus executed, thereby starting the SET operation for a phase change device PCM02 of a memory cell CELL02. In the SET operation, the potential of the bit line is set to 0.8 V, and approximately a few micro-mps of current continues to flow in the case where the device has a high resistance. If such conditions remain for 100 nanoseconds to a few microseconds (e.g. 100 nanoseconds to 10 microseconds), the device is crystallized and has a low resistance. Note that the same level of voltage is applied to the device whose resistance has already been low. At this time, a 50 micro-amps of current or greater flows to such a device. Similarly, a large current flows to the device having completed the SET operation and having a low resistance.

The SET end signal SETEND shifts from "L" to "H", upon the elapse of a predetermined time based on the SET time timed by the timer circuit TIMER_SET circuit. Then, the potential of the bit line BL2 shifts slowly from the first potential to "L". In this case, if the potential of the bit line BL2 shifts too fast, the device is made amorphous and will have a high resistance. Therefore, it is necessary to let the potential shift over 5 nanoseconds. Upon complete shift of the potential, the RESET operation for the memory cell CELL00 begins. Write data WDATAI0 is input to the bit line BL0, and the potential of the bit line reaches a second potential (e.g. the source potential 1.2 V) greater than the first potential. In the case where the device has a low resistance, approximately tens of micro-amps of current keeps flowing from the bit line to the source line. If such conditions remain from 5 nanoseconds to tens of nanoseconds (e.g. 20 nanoseconds to 100 nanoseconds), the device turns into a meltdown state.

The RESET end signal RESETEND shifts from "L" to "H", upon the elapse of a predetermined time based on the RESET time timed by the timer circuit TIMER_RESET. Then, the RESET completion operation begins. The bit line BL0 shifts quickly from "H" to "L", thereby radically decreasing the voltage to be applied to the device for rapid cooling of the device. As a result of this rapid cooling, the memory device PCM00 is not crystallized, made amorphous and has a high resistance. The same level of voltage is applied to a high resistance device. At this time, a few micro-amps of current or greater flows to the device. Note, in this case, if the voltage is applied thereto for tens of nanoseconds, the resistance of the device safely remains.

Subsequently, the description will now be made to the VERIFY-READ operation for checking whether the write operation has satisfactorily been executed. At the time the VERIF-READ operation begins, a control signal PC0 is set to "L". As a result, the bit lines (BL0, BL2) connected to the memory cell CELLs with written data are precharged, for example, to 0.5 V. Next, the word line WL0 shifts from "L" to "H" so as to be active, and the precharge control signal PC0 shifts from "L" to "H", resulting in a current flowing from the bit lines (BL0, BL2) to the source line SL0. Because a high resistance value is written in the memory cell CELL00, the bit line BL0 does not almost shift. On the other hand, a low resistance value is written in the memory cell CELL02, the bit line BL2 is quickly discharged. Because the bit line BL2 is quickly discharged, (e.g. in a few nanoseconds or so), thereby restraining the heat to be generated. As a result, the crystalline structure of the memory device PCM02 does not change, thus preventing data destruction. In this case, a voltage should preferably be applied to the memory device PCM02 in a range from 2 nanoseconds to 10 nanoseconds. After the potential of each bit line is securely obtained, predetermined amplifier circuits (CINV0, CINV4) are selected in accordance with column control signals (YSRT0, YSRB0), and signals of the bit lines (BL0, BL2) are output as read data (RDATAI0, RDATAI1).

Finally, the READ operation for reading data will now specifically be described. At the time the READ operation begins, the control signal PC0 is set to "L". As a result, the bit lines (BL0, BL2) connected to the memory cell CELLs with written data are precharged, for example, to 0.5 V. The word line WL0 shifts from "L" to "H" so as to be active, and the precharge control signal PC0 shifts from "L" to "H" so as to be inactive, resulting in a current flowing from the bit lines (BL0, BL2) to the source line SL0. Because a high resistance value is written in the memory cell CELL00, the bit line BL0 does not almost shift. On the other hand, because a low resistance value is written in the memory cell CELL02, the bit line BL2 is quickly discharged. After the potential of each bit line is securely obtained, the predetermined amplifier circuits (CINV0, CINV4) are selected in accordance with the column control signals (YSRT0, YSRB0), and signals of the bit lines (BL0, BL2) are output as read data (RDATAI0, RDATAI1).

In this embodiment, the SET and RESET operations are separately executed at different timings. However, the present invention is not limited to this, and the RET and RESET operations may parallelly be executed.

(Control of Source Line)

Figure 10:
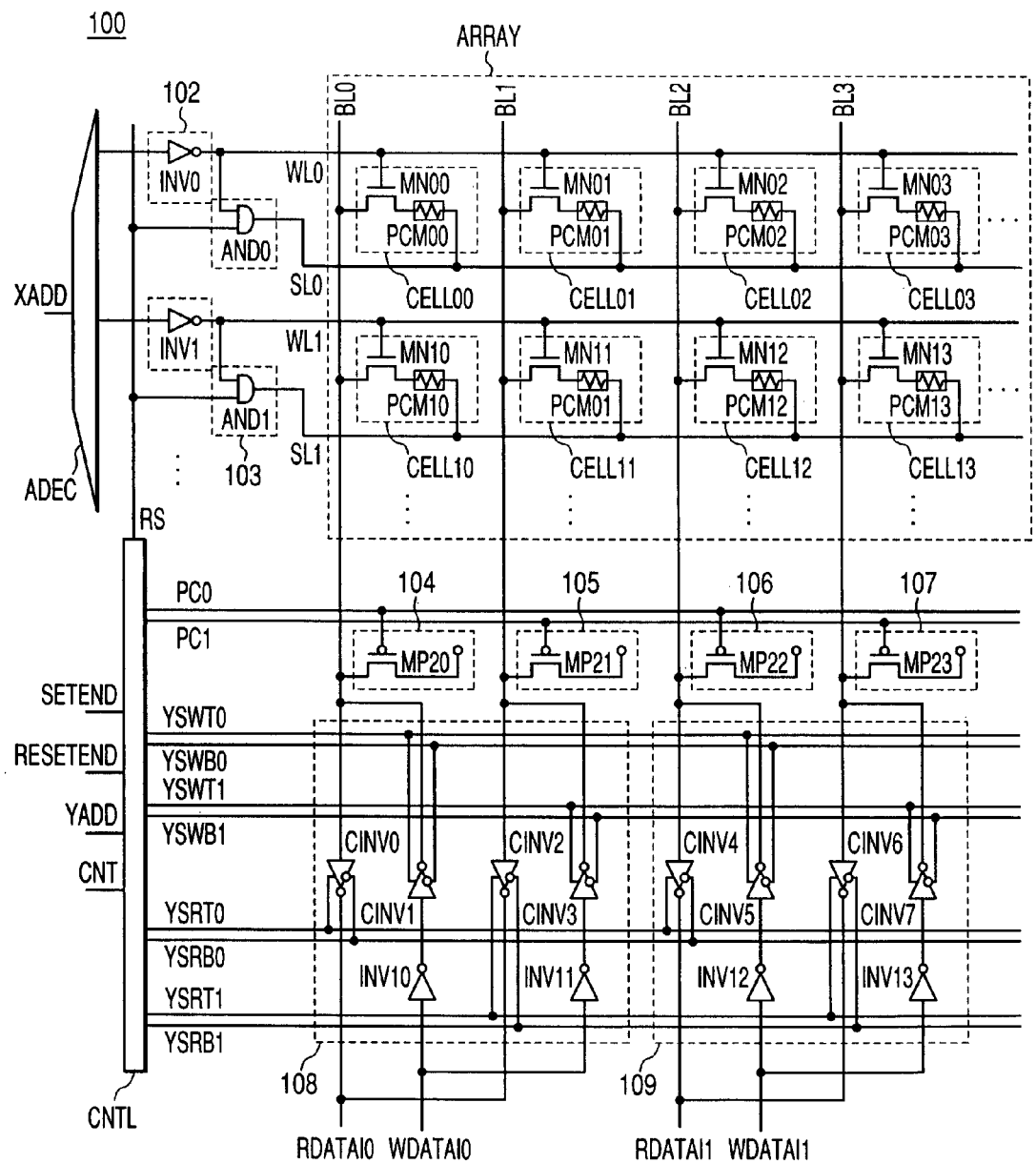
FIG. 10 is a circuitry diagram showing an embodiment of the memory block shown in FIG. 2.

FIG. 10 is a diagram for explaining another embodiment of the memory block illustrated in FIG. 2. Unlike the memory block of FIG. 5, in the memory block 100 of FIG. 10, the third node of each memory cell is connected to the source line SL, instead of being connected to the ground potential. Each source line SL is connected to a source driver circuit, thus enabling to control its potential. The source line SL is elongated in the same elongated direction of the word lines in order to control data processing in the unit of word line. The source driver circuit includes an AND circuit AND0, and can control the source lines SL in accordance with data of the decoder circuit ADEC and the control signal RS. The write circuit includes inverters CINV1, 3, 5 and 7. More memory cells are connected to the source lines than those connected to the bit lines. In this configuration, the bit lines are lightly loaded, and thus can be operated at high speed.

As explained above, it is difficult to obtain the margin of the SET and RESET operations, if the MOS transistors of a minimum process size are used. In this embodiment, the source lines can be controlled, and the current is controlled to flow in a reverse direction between the SET and RESET operations. Specifically, in the RET operation requiring a relatively low current, a greater potential is supplied to the bit lines than the potential supplied to the source lines. On the other hand, in the RESET operation requiring a relatively high current, a greater potential is supplied to the source lines than the potential supplied to the bit lines. In this manner, the direction of the current changes across the SET operation and the RESET operation. In the RESET operation requiring a relatively large current, in the N-channel MOS transistor MN00 of the memory cell CELL00, the potential difference across the gate and source electrodes will be equal to the source voltage, thereby a large current is obtained. In the SET operation requiring only a relatively low current, in the N-channel MOS transistor MN02 of the memory cell CELL02, the potential difference across the gate and source electrodes will be lower than the source potential, thereby a relatively low current is sufficient. As a result, the SET and RESET operations can clearly be distinguished. In other words, a large margin between the current values can be obtained across the SET and RESET operations. In the SET operation, because a high potential is supplied to the bit lines, the source electrode is provided on the side of the node N3. In the RESET operation, because a high potential is supplied to the source lines, the source electrode is provided on the side of the node N2. The potential difference across the gate and source electrodes is lower than the source voltage in the SET operation. This is because a voltage drop occurs in the memory device PCM02, even if the potential difference across the gate electrode and the source line SL0 is equal to the source voltage. In the memory block of FIG. 5, the bit lines are active both in the SET and RESET operations, and further two different levels of potentials are supplied in order to clearly distinguish between the SET and RESET operations. In contrast, in this embodiment, depending on the characteristics of the phase change element, the same level of potential can be supplied to the bit lines by changing the direction of the current flowing to the memory cells. In addition, the write circuit may possibly be made simple. In the memory cell having the configuration of FIG. 6B, the potential relationship is opposite to that described above. If the SET operation can not satisfactorily be achieved only by changing the direction of the current, the potential difference across the bit and source lines may be changed. In this case also, a large current difference can be obtained in the SET and RESET operations, resulting in easy processing.

Figure 11:
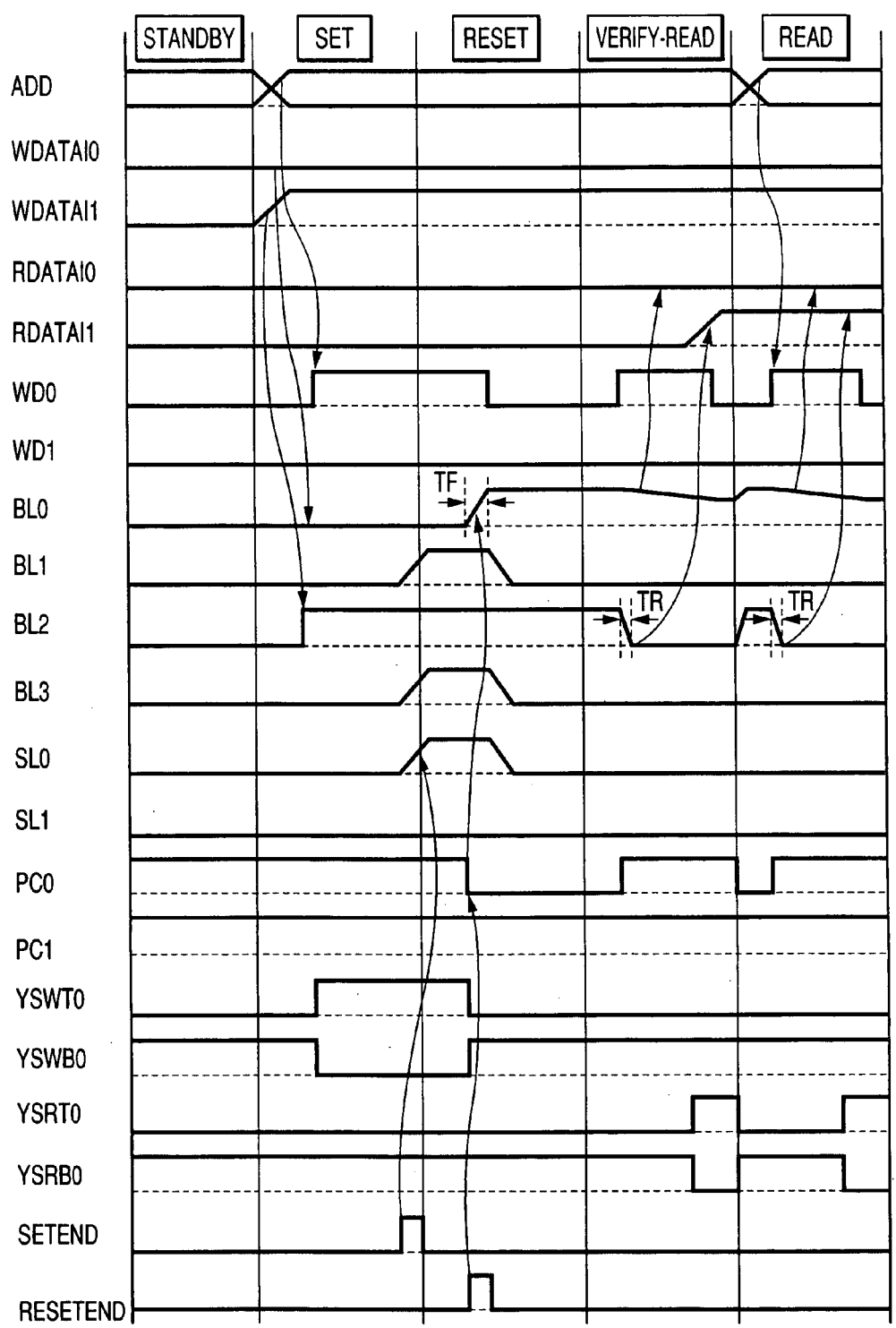
FIG. 11 is an operational waveform diagram for the memory block shown in FIG. 10.

FIG. 11 is a diagram for specifically explaining operations of the memory block. Before the SET operation begins, the decoder circuit and the word driver circuit, etc. perform the same operations as those shown in FIG. 9. In the SET operation of this embodiment, the potential of the bit lines is equal to the source potential (i.e. 1.2 V), and the source lines SL are maintained at 0 V. In the case where the device has a high resistance, a few micro-amps of current keeps flowing. This voltage difference may be lower or greater than the source voltage. However, only if the potential is equal to the source voltage, the small size of the voltage generator VGEN can be realized. If this state remains in a range from 100 nanoseconds to a few micro-nanoseconds (e.g. 100 nanoseconds to 10 microseconds), the device can be crystallized and has a low resistance. The same level of voltage can be applied to the device whose resistance has already been low. At this time, a current of 50 micro-amps or greater flows to the device. Similarly, a large current flows to the device having completed the SET operation and having a low resistance.

The SET end signal SETEND shifts from "L" to "H", upon the elapse of a predetermined time based on the SET time timed by the timer circuit TIMER_SET circuit. The source line SL0 slowly shifts from "L" to "H". At this time, if the source line SL0 shifts too fast, the device is made amorphous and will have a high resistance. Therefore, it is necessary to let the bit line shift over 5 nanoseconds. If the source line SL0 slowly shifts, the bit lines (BL1, BL3) in a floating state slowly shifts from "L" to "H" as well. Upon complete shift of the lines, the RESET operation for the memory cell CELL00 begins. In the RESET operation, the potential of the bit lines is maintained at 0 V, while the source lines SL are maintained at the source voltage of 1.2 V. In this case, if the device has a low resistance, tens of micro-amps of current keeps flowing from the source lines to the bit lines. If such conditions remain from 5 nanoseconds to tens of nanoseconds (e.g. 20 nanoseconds to 100 nanoseconds), the device turns into a meltdown state.

The RESET end signal RESETEND shifts from "L" to "H", upon the elapse of a predetermined time based on the RESET time timed by the timer circuit TIMER_RESET. Then, the RESET completion operation begins. The control signal PC0 shifts from "H" to "L", and the bit line BL0 shifts quickly from "L" to "H", thereby radically decreasing a voltage to be applied to the device for rapid cooling of the device. As a result of this rapid cooling, the memory device PCM00 is crystallized, made amorphous and has a high resistance. To activate the bit lines BL within a shift time TF (e.g. a few nanoseconds, etc.) required for making the memory device amorphous, the product of the bit line capacitance and the on-resistance of the P-channel MOS transistors (MP20, MP22) (for precharging) needs to be so set that lower than the shift time TF. In particular, one hundred twenty eight or sixty four (bits) memory cells are preferably connected to the bit lines. In this case, a current of a few micro-amps or greater flows to the memory device. Note, in this case, if the current flows for a few nanoseconds or so, the resistance of the memory device safely remains. As long as a voltage is applied to the memory device for 2 nanoseconds to 10 nanoseconds during the read operation, destruction of data can be prevented.

Subsequently, description will now be made to the VERIFY-READ operation for checking whether a write operation has satisfactorily been executed. At the time the VERIFY-READ operation begins, the control signal PC0 is set to "L". As a result, the bit lines (BL0, BL2) connected to the memory cells CELL with written data are precharged, for example, to a source voltage of 1.2 V. Next, the word line WL0 shifts from "L" to "H" to as to be active, and at the same time the precharge control signal PC0 shifts from "L" to "H" so as to be inactive, resulting in a current flowing from the bit lines (BL0, BL2) to the source line SL0. Because a high resistance value is written in the memory cell CELL00, the bit line BL0 does not almost change in its state. On the other hand, because a low resistance value is written in the memory cell CELL02, the bit line BL2 can quickly be discharged. The bit line BL2 is discharged quickly (e.g. a few nanoseconds), thereby restraining the heat to be generated. As a result, the crystalline structure of the memory device PCM02 does not change, and destruction of data can be prevented. After the potential of each bit line is securely obtained, amplifier circuits (CINV0, CINV4) are desirably selected in accordance with the column control signals (YSRT0, YSRB0), and a signal of each bit line (BL0, BL2) is output as read data (RDATAI0, RDATAI1).

Finally, description will now be made to the READ operation for reading data. At the time the READ operation begins, the control signal PC0 is set to "L". As a result, the bit lines (BL0, BL2) connected to the written memory cell CELL are precharged, for example, to a source voltage of 1.2 V. The word line WL0 shifts from "L" to "H" so as to be active, while the precharge control signal PC0 shifts from "L" to "H" so as to be inactive, resulting in a current flowing form the bit lines (BL0, BL2) to the source line SL0. Because a high resistance value is written in the memory cell CELL00, the bit line BL0 does not almost change in its state. On the other hand, a low resistance value is written in the memory cell CELL02, the bit line BL2 is quickly discharged. After the potential of each bit line is securely obtained, amplifier circuits (CINV0, CINV4) are desirably selected in accordance with the column control signals (YSRT0, YSRB0), and each signal of the bit lines (BL0, BL2) is output as read data (RDATAI0, RDATAI1).

As explained above, the current direction reverses between the SET operation and the RESET operation. In the RESET operation requiring a large current, in the N-channel MOS transistor MN00 of the memory cell CELL0, the potential difference across the gate and drain electrodes will be equal to the source voltage, thereby obtaining a large current. In the SET operation requiring only a low current, in the N-channel MOS transistor MN02 of the memory cell CELL02, the potential difference across the gate electrode and the source electrode is lower than the source potential, thereby only a low current is necessary. As a result, the SET operation and the RESET operation can clearly be distinguished. Further, the source line is activated, when executing the RESET operation slowly after the SET operation. On the other hand, the bit line is activated, at the end time of the RESET operation or in the READ operation (including the VERIFY-READ operation) that needs to quickly be executed. Therefore, the source line is greatly loaded, while the bit line is lightly loaded, achieving the control of the shift time without any additional circuit.

In this embodiment, the threshold voltage of the memory cell is low. However, it is not limited to the low threshold value for the memory cell. Even if a low threshold value is not given to the memory cell, the above-described effect can be expected, as long as the direction of current flowing to the memory cell CELL is changed across the SET operation and the RESET operation. However, if the threshold value of the memory cell is low, a large current can flow to the memory cell. As a result, the current can easily be controlled in the SET operation and the RESET operation, realizing stable operations of the memory block.

(Prevention of Leakage Current in READ Operation)

Figure 12:
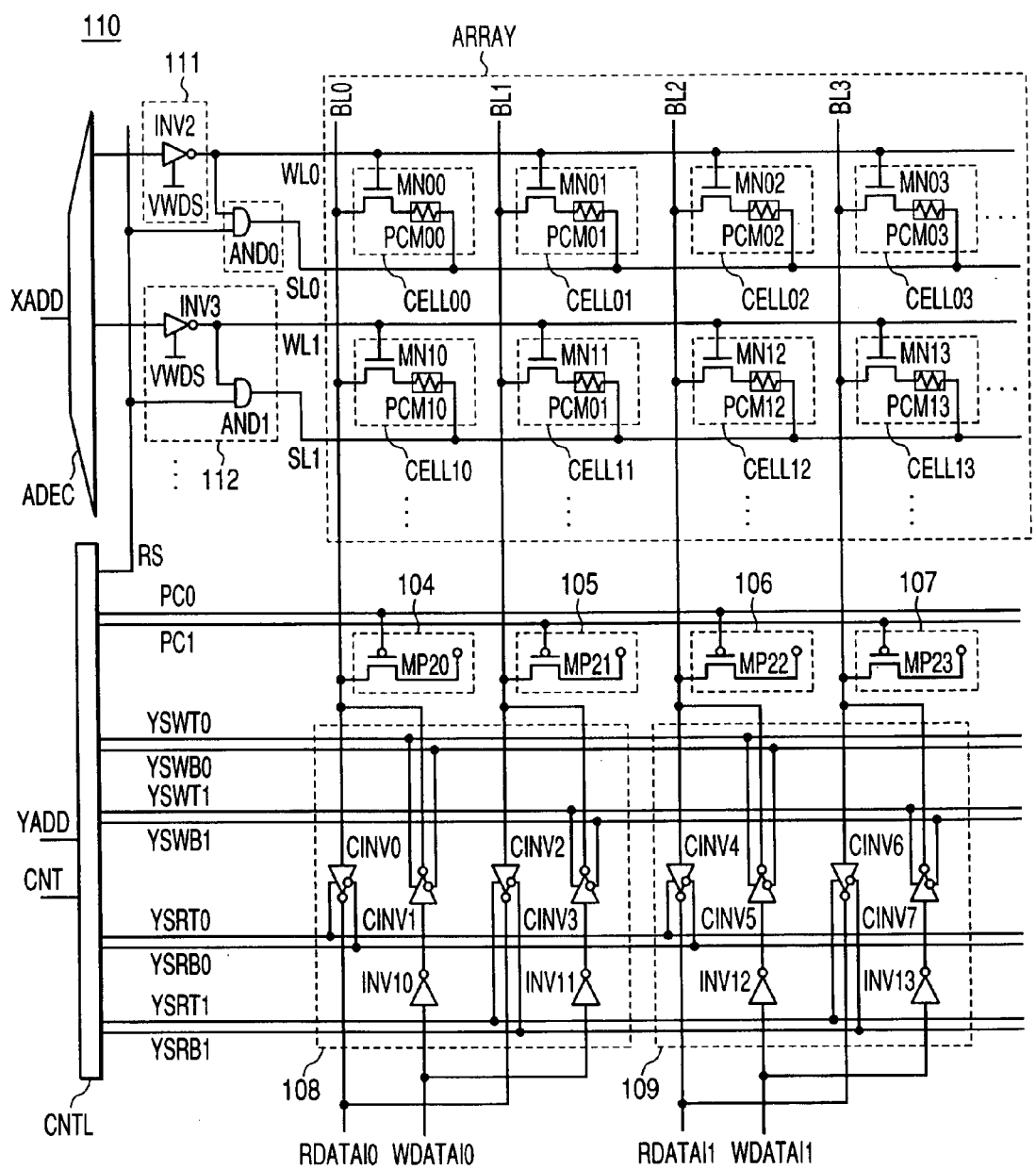
FIG. 12 is a circuitry diagram showing an embodiment of the memory block shown in FIG. 2.

FIG. 12 is a diagram for explaining still another embodiment of the memory block 100 of FIG. 2. As explained above, the RESET current can be acquired by increasing the obtained current, using the MOS transistor of a minimum process size. However, if the threshold voltage is set to a low value, a large leakage current flows in the MOS transistor, even in the case where the transistor is not a "selected one". If this leakage current flows to the bit lines during the READ operation, an undesirable noise may be generated. Even if the threshold value of the MOS transistor is not set to a low value on purpose, a leakage current (e.g. a sub-threshold current, etc.) is generated as a result of miniaturization of the MOS transistor, causing an undesirable noise as a problem.

Unlike the memory block of FIG. 10, in a word driver circuit of a memory block 110 shown in FIG. 12, a ground potential terminal of an inverter circuit INV2 is connected to a source line VWDS. In addition, in the case where the memory cell is not selected, a negative potential lower than the ground potential is supplied. That is, if the memory cell is in a non-selected state, a negative potential is supplied to the gate of its MOS transistor. This results in an increase in the resistance of the MOS transistor, and a leakage current hardly flows thereto.

Figure 13:
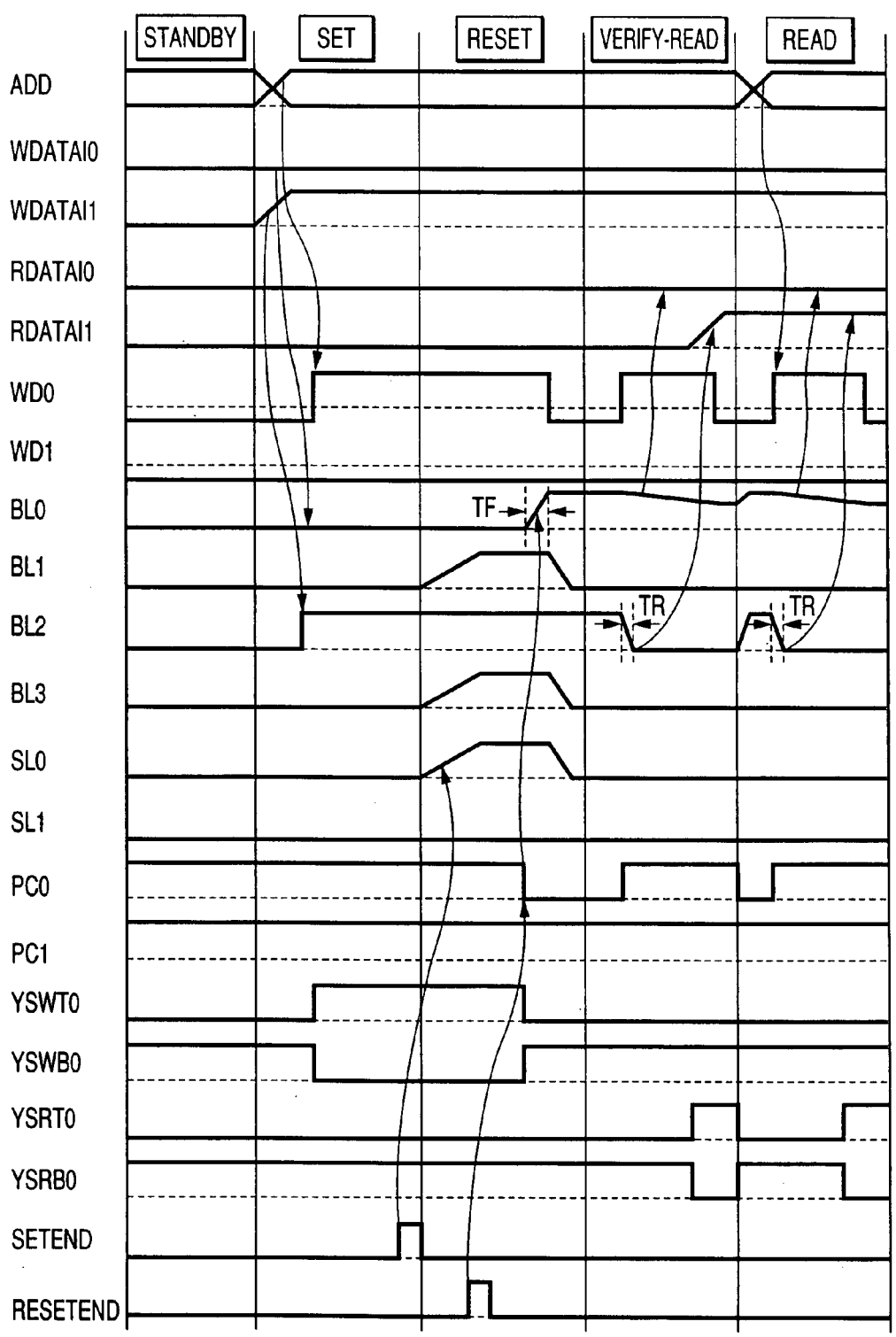
FIG. 13 is an operational waveform diagram for the memory block shown in FIG. 12.

FIG. 13 is a diagram for explaining operations of the memory block 110. Signals are initially in a STANDBY mode, as shown in the first section of FIG. 13. The potential of the word line is set, for example, to −0.3 V lower than the ground potential. In such a condition, the a negative voltage is applied between the gate electrode and the source electrode of each N-channel MOS transistor MN of the memory cell CELL. This results in a reduction of the leakage current. The write operation is now executed. Because the SET and RESET operations have already been described with reference to FIG. 11, the description will not be made in this embodiment. In the VERIFY-READ operation, the selected word line WD remains at a negative potential. In the N-channel MOS transistor of a non-selected memory cell CELL, a negative voltage is applied between the gate electrode and the source electrode thereof, thus reducing the leakage current and preventing discharging of the bit line BL in the non-selected memory cell CELL. Additionally, stable reading of data can be achieved at high speed. The READ operation is similarly operated as the VERIFY-READ operation.

Figure 14:
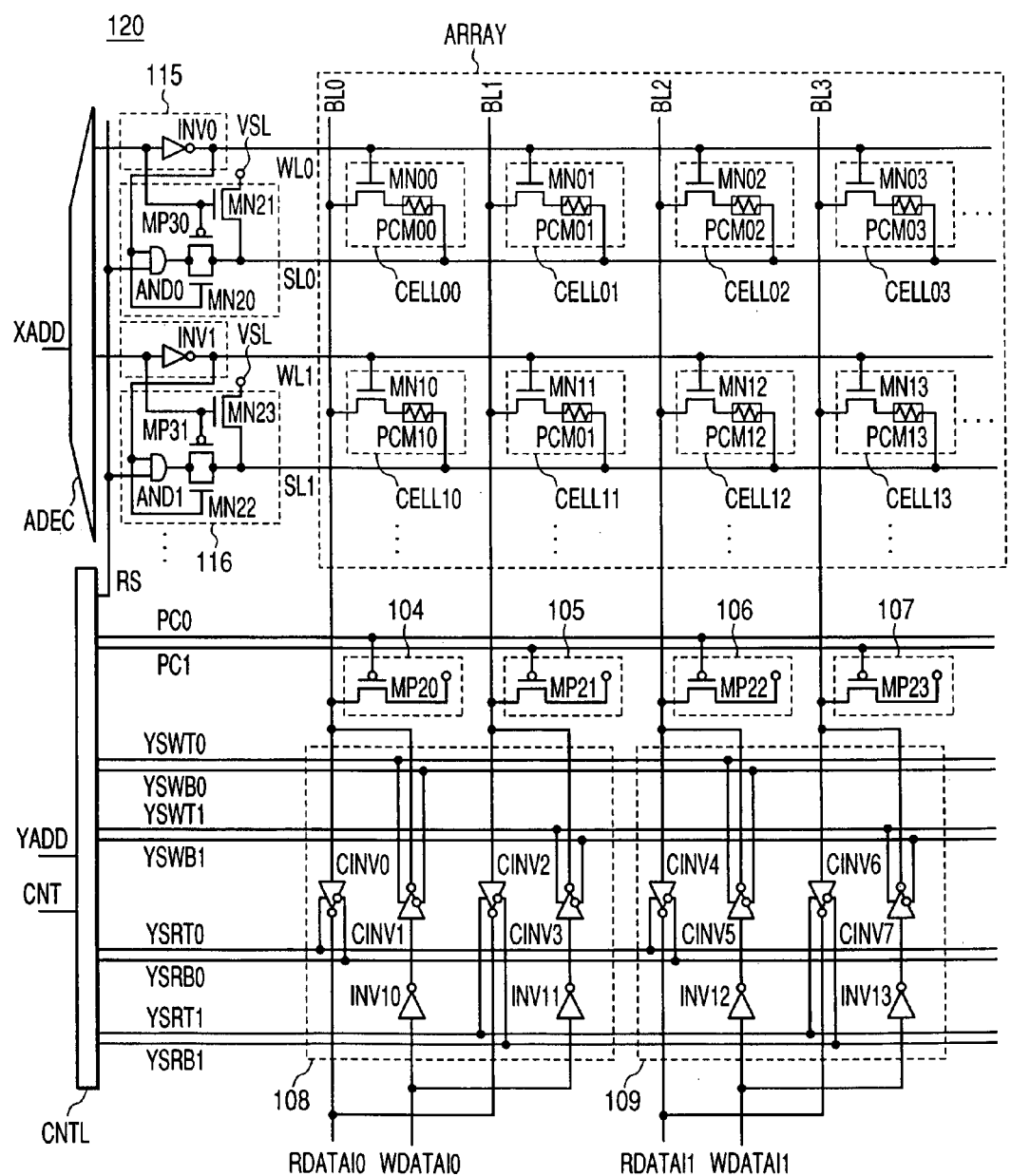
FIG. 14 is a circuitry diagram showing an embodiment of the memory block shown in FIG. 2.

FIG. 14 is a diagram for explaining a memory block 120 according to a second embodiment of the present invention. This memory block has overcome the problem of the noise resulting from the leakage current in the non-selected memory cell CELL. In FIG. 14, unlike the memory block of FIG. 10, a source driver circuit SDR is comprised of an AND circuit AND0, N-channel MOS transistors (MN20, MN21), and a P-channel MOS transistor MP30. The gate electrode of each of the N-channel MOS transistors (MN20, MN21), and P-channel MOS transistor MP30 is coupled to the data of the decoder circuit ADEC. A supply line VSL is connected to the drain electrode of the N-channel MOS transistor MN21. A source line precharge potential (e.g. 0.3 V) is supplied to the supply line VSL. In this case, the source line precharge potential is greater than the ground potential and lower than the source potential. The source line SL can be controlled in accordance with the control signal RS. In this embodiment, the source driver circuit supplies a source line precharge potential to the source line being in a standby or non-selected state. As a result, in the MOS transistor included in the memory cell in a non-selected state, a negative voltage is supplied between the gate electrode and the source electrode, thereby reducing the leakage current.

Figure 15:
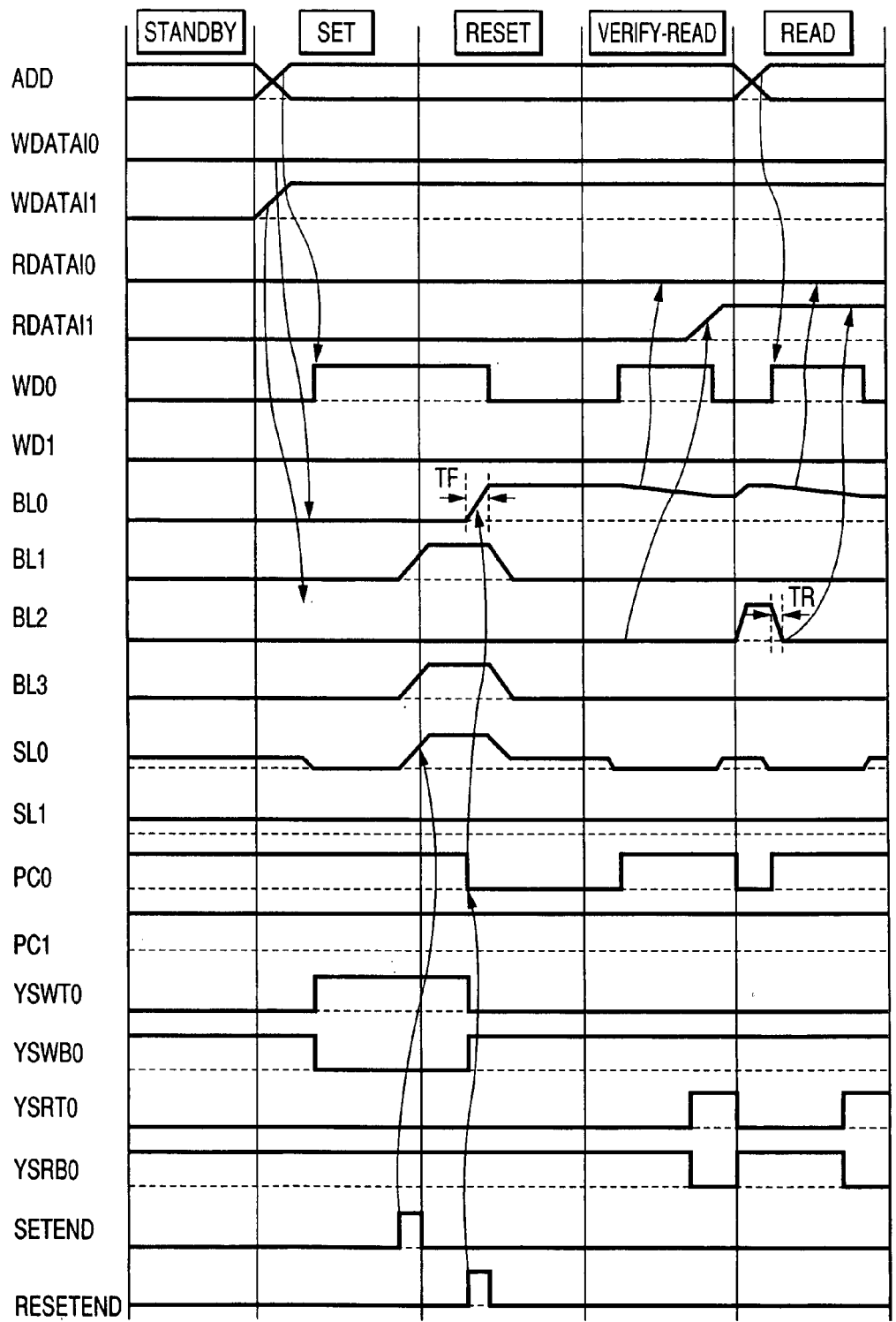
FIG. 15 is an operational waveform diagram for the memory block shown in FIG. 14.

FIG. 15 is a diagram for explaining operations of the memory block. Description will now be made mainly to those operations of FIG. 15 that are different from the operations of FIG. 11. Signals are initially in a STANDBY mode, as shown in the first section of FIG. 15. The potential of the word lines is a ground potential. The source lines SL is set, for example, to 0.3 V that is greater than the ground potential. In such a condition, a negative voltage is applied between the gate and source electrodes of the N-channel MOS transistor MN of the memory cell CELL, thereby reducing the leakage current. The write operation now begins. In this embodiment, the source lines are precharged to 0.3 V are precharged to 0.3 V, thereby activating the SET operation. At the same time the word line WD0 is selected, the potential of the source line SL0 is set to the ground potential. As a result of this condition, a potential difference occurs between the bit lines BL2 and the source line SL0, and the memory device PCM02 is crystallized. The SET end signal SETEND shifts from "L" to "H", and the source line slowly shifts from "L" to "H". Upon completion of the shift, a potential difference occurs between the bit line BL0 and the source line SL0. Then, the RESET operation for the memory cell CELL00 begins, and the memory device PCM00 is made amorphous.

The VERIFY-READ operation will now be described. At the time the VERIFY-READ operation begins, the bit line is precharged to a source potential. The word line WL0 will be "H" so as to be active, resulting in a current flowing from the bit lines (BL0, BL2) to the source line SL0. In this case, in the non-selected memory cell CELL, the potential of the source line SL is greater than the ground potential. As a result, a negative voltage is applied between the gate and source electrodes of the N-channel MOS transistor of the non-selected memory cell CELL, thereby reducing the leakage current. Hence, in the non-selected memory cell CELL, the bit line BL can be avoided from being discharged, and stable read operations can be performed at high speed. Note that the READ operation is similarly operated as the VERIFY-READ operation.

As described above, the threshold voltage of the transistor in the memory cell is lower than that of the MOS transistor of the IO circuit. In addition, the current direction reverses between the SET and RESET operations. As a result, the problem of the leakage current can be overcome, and stable operations of the memory block can be realized.

In FIG. 12 to FIG. 15, the threshold voltage of the memory cell is lower than that of the MOS transistor of the IO circuit. However, the threshold value of the memory cell is not necessarily set lower than that of the MOS transistor. This is because a leakage current may possibly be generated, even if the threshold value of the memory cell is equal to that of the MOS transistor of the input/output circuit IO. Note, however, that if a low threshold voltage of the MOS transistor in the memory cell is set, a large current can be acquired and stable read operations would be realized. As described above, the current direction reverses between the SET operation and the RESET operation. However, the present invention is not limited to the above. According to this embodiment, the leakage current can be prevented so as to reduce a noise in the read operations, in the memory cell having such a MOS transistor in which a leakage current may usually be generated.

(Prevention of Information Destruction in Read Operation)

Figure 16:
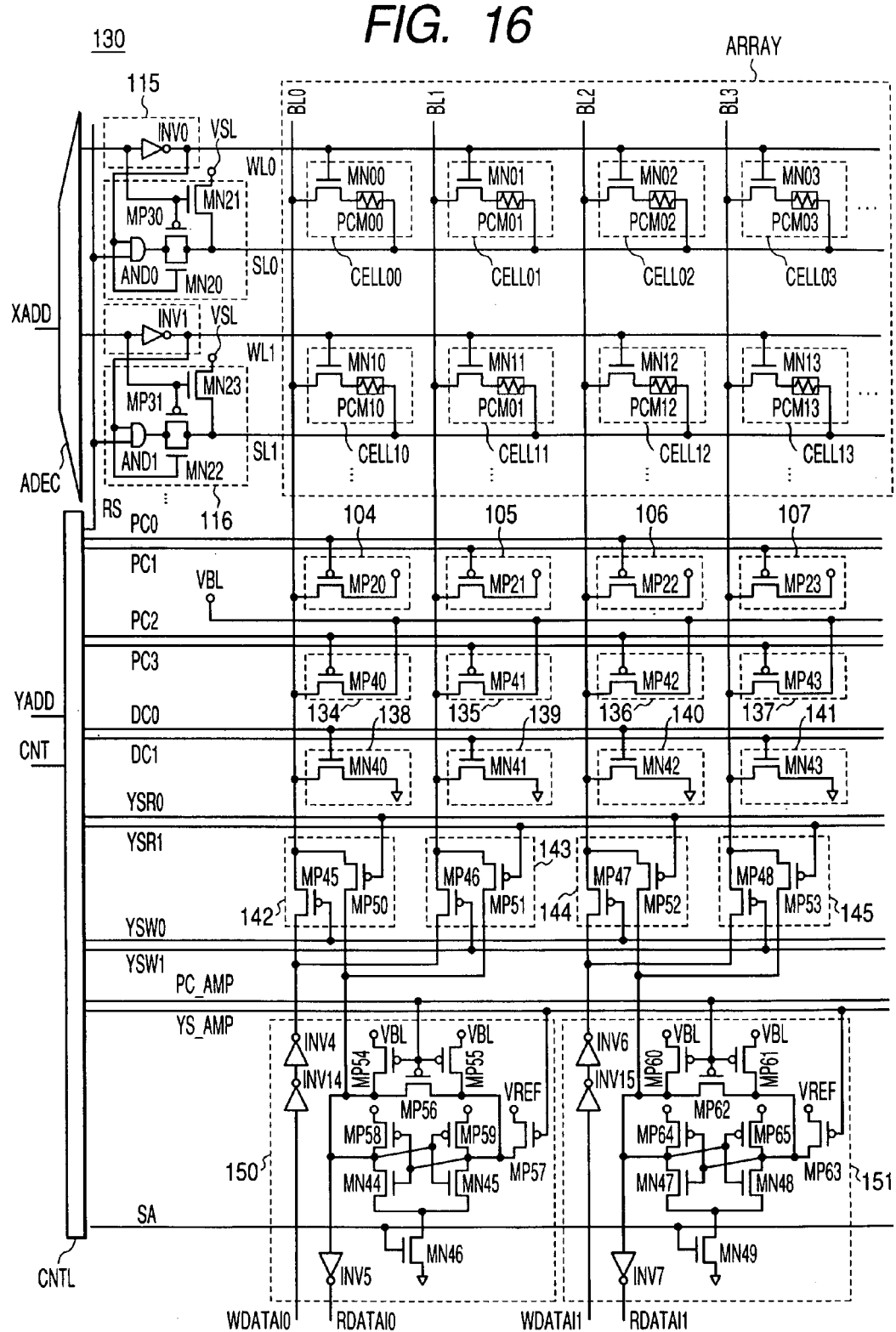
FIG. 16 is a circuitry diagram showing an embodiment of the memory block shown in FIG. 2.

FIG. 16 is a diagram for explaining yet still another embodiment of the memory block 100 shown in FIG. 2. The phase change element has such a characteristic that its resistance value changes in accordance with a temperature of heat applied thereto. In the case where information is stored in the phase change element, the information may undesirably be destructed due to heat generated as a result of current flowing in the read operation, when there is no need to rewrite the stored information. This problem can be overcome by discharging the bit line quickly at the time of the READ operation (including the VERIFY-READ operation). However, the discharge may be quickly achieved, depending on the capacitance of the bit line.

In this embodiment, the bit line is discharged to a potential (e.g. 0.6 V) lower than the source potential and greater than the potential of the source line in the READ operation, thereby decreasing the value of current flowing to the memory cell in the READ operation and also avoiding information destruction. FIG. 16 shows an embodiment of a memory block wherein a decreased current flows to the memory cell in the READ operation. What differs mainly from the memory block of FIG. 14 are as follows.

The bit lines BL are connected to read precharge circuits (134, 135, 136, 137). For example, the precharge circuit 134 includes a P-channel MOS transistor MP40. In this case, the drain electrode, the gate electrode and the source electrode are coupled to the bit line BL0, a control signal PC2, and a supply line VBL, respectively. The voltage of the supply line VBL is lower than the power source, and the supply line VBL is used for reading data.

The bit lines BL are connected to discharge circuits (138, 139, 140, 141). For example, the discharge circuit 138 includes an N-channel MOS transistor MN40. In this case, the drain electrode, the gate electrode and the source electrode are coupled to the bit line BL0, a control signal DC0, and the ground potential, respectively. The discharge circuits are used for discharging the bit lines to the ground potential. Such discharge circuits are provided, because the bit lines are not discharged to the ground potential in the configuration that the P-channel MOS transistors are provided between the bit lines and the sense amplifier circuit 150 in Y switches 142, 143, 144 and 145. With the discharge circuits, the bit lines can quickly be discharged. In the rest of embodiments, such discharge circuits may be provided in order to quickly discharge the bit lines.

The bit lines BL are connected further to the Y switch circuits (142, 143, 144, 145), respectively. The Y switch circuits are connected also to the write/read circuits (150, 151). For example, the Y switch circuit 142 includes P-channel MOS transistors (MP45, MP50). The P-channel MOS transistor MP45 is used for writing data. In the transistor MP45, the drain electrode, the gate electrode and the source electrode are coupled to the bit line BL0, a control signal YSW0, and the write/read circuit 150, respectively. The P-channel MOS transistor MP50 is used for reading data. In the P-channel MOS transistor MP50, the drain electrode, the gate electrode and the source electrode are coupled to the bit line BL0, a control signal YSR0, and the write/read circuit 150, respectively.

The write/read circuit 150 includes write circuits (INV4, INV14) and a read circuit. This read circuit is comprised of a sense amplifier circuit, a sense amplifier precharge circuit, a reference Y switch circuit, and an output circuit. In this case, the sense amplifier circuit includes N-channel MOS transistors (MN44, MN45, MN46), and P-channel MOS transistors (MP54, MP55, MP56). The sense amplifier precharge circuit includes P-channel MOS transistors (MP54, MP55, MP56). The reference Y switch circuit includes a P-channel MOS transistor MP57. The output circuit includes an inverter circuit INV5. The sense amplifier circuit is a latch type sense amplifier circuit which comprises a flip flop and a N-channel MOS transistor MN46 for activating the sense amplifier. The flip flop includes P-channel MOS transistors (MP58, MP59) and N-channel MOS transistors (MN44, MN46). A control signal SA is coupled to the gate of the N-channel MOS transistor MN46. The sense amplifier precharge circuit comprises P-channel MOS transistors (MP54, MP55) and a P-channel MOS transistor MP56. The P-channel MOS transistors (MP54, MP55) connect between the supply line VBL and the internal node of the sense amplifier. The P-channel MOS transistor MP56 equalizes the internal node of the sense amplifier circuit. A control signal PC_AMP is coupled to the gate electrode of each of the P-channel MOS transistors (MP54, MP55, MP56). In the P-channel MOS transistor MP57 of the reference Y switch circuit, the gate electrode and the source electrode are coupled to a control signal YS_AMP and a reference voltage VREF, respectively. In this embodiment, a differential sense amplifier circuit is adopted, because the bit lines BL are set to a read source potential (0.6 V) lower than the source potential. Note that the reference potential VREF should be set in the middle of the read source potential and the ground potential. For example, in this embodiment, the source (supply) potential VSL (e.g. 0.3 V) is employed, the voltage generator circuit VGEN can be made small by supplying the source potential VSL. The read data RDATAI0 is output from the write/read circuit 150, and the write data WDATAI0 is input to the write/read circuit 150. In such a configuration, the potential of the bit lines can be set lower than the source potential in the read operation, decreasing the value of current flowing to the memory device, avoiding data destruction and thus improving the product reliability.

Figure 17:
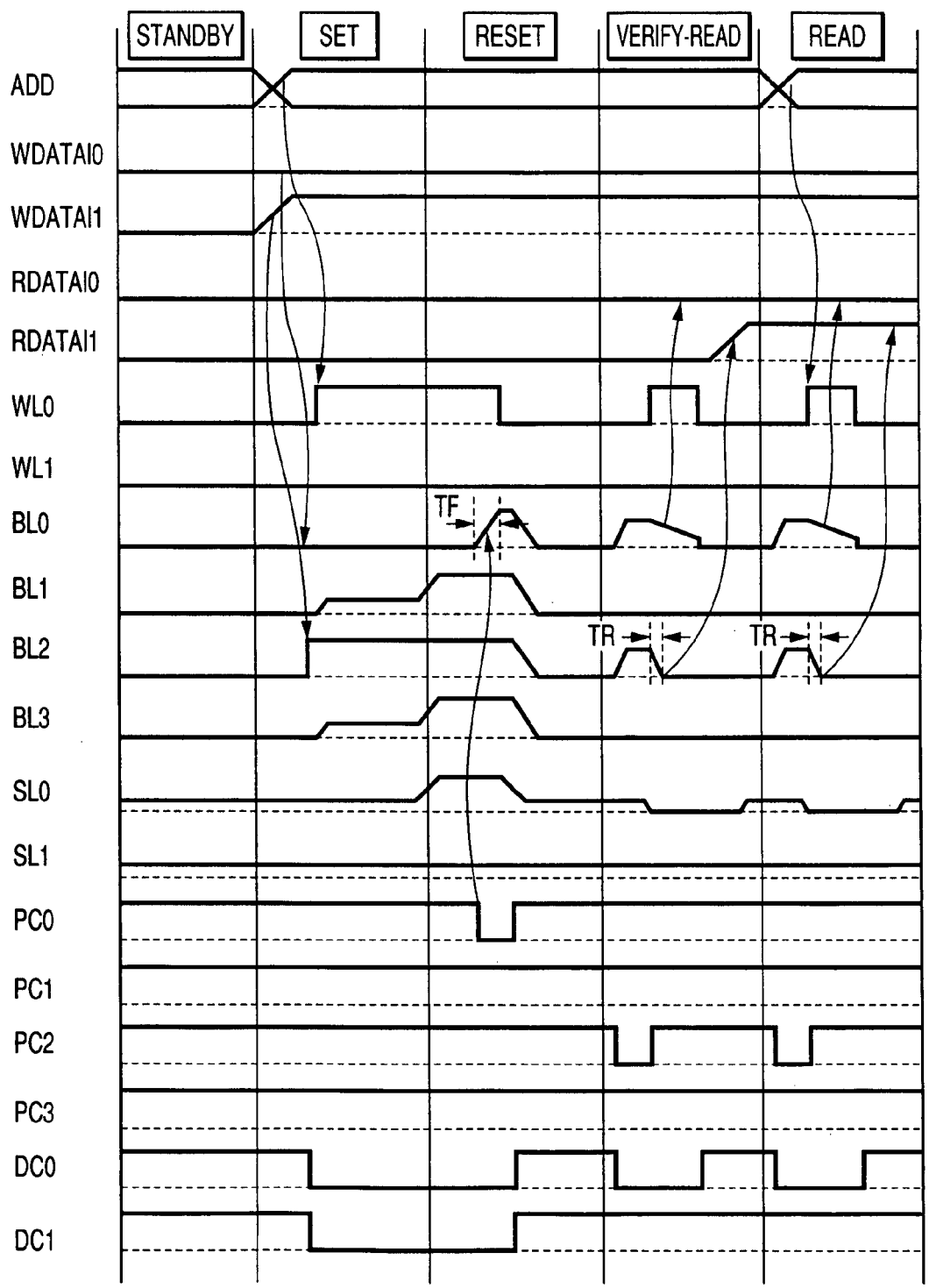
FIG. 17 is an operational waveform diagram for the memory block shown in FIG. 16.
Figure 18:
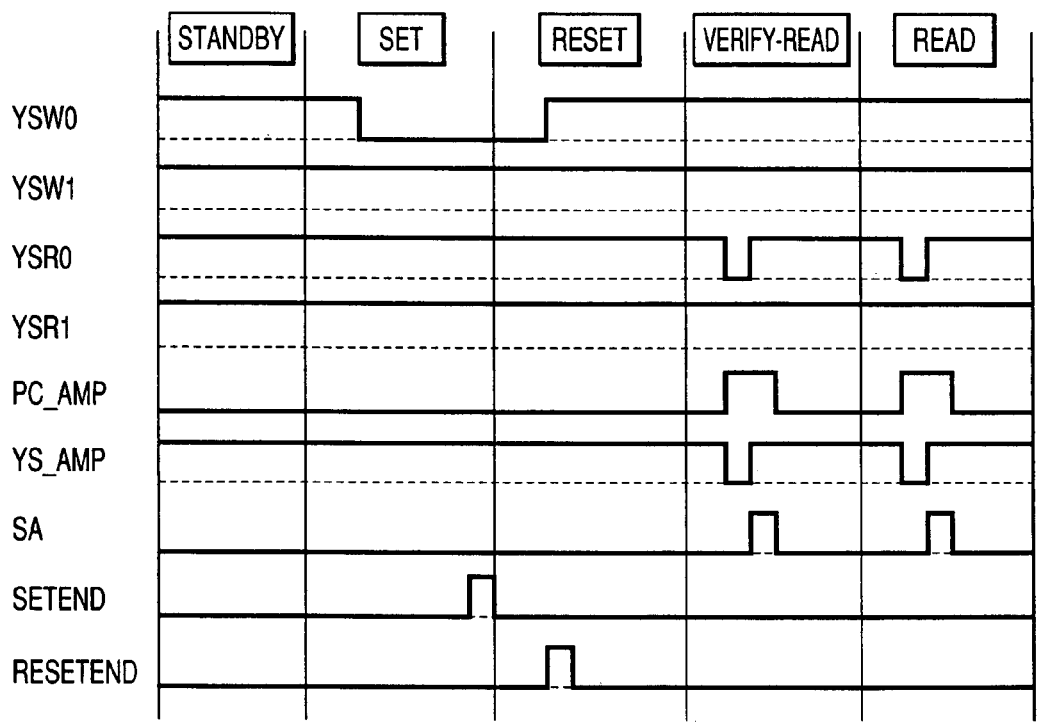
FIG. 18 is an operational waveform diagram for the memory block shown in FIG. 16.

FIG. 17 and FIG. 18 are diagrams for explaining operations of the memory block. The SET operation and the RESET operations are the same as those shown in FIG. 15. In this embodiment, a potential difference between the bit line and the source line in the SET operation is lower than that in the RESET operation. In FIG. 15, the precharged (to 0.3 V) source line shifts to the ground potential in the SET operation. However, if such a potential difference in the SET operation is equal to that in the RESET operation, an excessive current may possibly flow. Thus, according to the present invention, the precharge potential is maintained in the SET operation, and the SET operation is executed with a potential difference lower than that in the RESET operation.

The VERIFY-READ operation will now be described. At the time the VERIFY-READ operation begins, the control signal PC2 is set to "L". As a result, the bit lines (BL0, BL2) connected to the memory cell CELL with written data are precharged to a potential of the supply line VBL. The potential of the supply line VBL is set, for example, to 0.6 V lower than the source potential. In this condition, data destruction in the reading can be prevented. The word line WL0 shifts from "L" to "H" so as to be active, while the precharge control signal PC2 shifts from "L" to "H" so as to be inactive, thereby a current flows from the bit lines (BL0, BL2) to the source line SL0. Because a high resistance value is written in the memory cell CELL00, the bit line BL0 does not almost change in its state. On the contrary, a low resistance value is written in the memory cell CELL02, the bit line BL2 is quickly discharged. The bit line signal is transmitted to the sense amplifier circuits (150, 151) in accordance with the control signal YSR0, amplified in accordance with the control signal SA, and output as read data (RDATAI0, RDATAI1). The reference potential VREF is supplied to the reference terminal of the sense amplifier circuits. The potential of the bit line BL0 is greater than VREF, and the read data RDATAI0 is set to "L". The potential of the bit line BL2 is lower than VREF, and the read data RDATAI1 is set to "H". As soon as the bit line signal is amplified by the sense amplifier circuits, the bit lines (BL0, BL2) are discharged to 0 V. Note that the READ operation is similarly carried out as the VERIFY-READ operation.

As described, the potential difference between the bit line and the source line in the read operation is lower than that in the writing. As a result, a low current flows to the memory device in the reading, thus enabling to avoid data destruction.

In this embodiment, a low voltage is applied to the memory device, thereby preventing data destruction in the reading. However, destruction of data can also be achieved, if a voltage is applied to the memory device in a short time. In this case, after the word line is ON, the bit lines (BL0, BL2) are precharged. In addition, as soon as the data is amplified by the sense amplifier circuits, the bit lines are discharged. For example, one hundred twenty eight or sixty four (bits) memory cells are connected to the bit lines, thus reducing parasitic capacitance. As a result, the bit lines can be discharged and precharged at high speed. In addition, a voltage is applied to the device in a short period of time (e.g. 2 ns or less), preventing data destruction in the read operation.

(Controlling of Shift Time)

Figure 19:
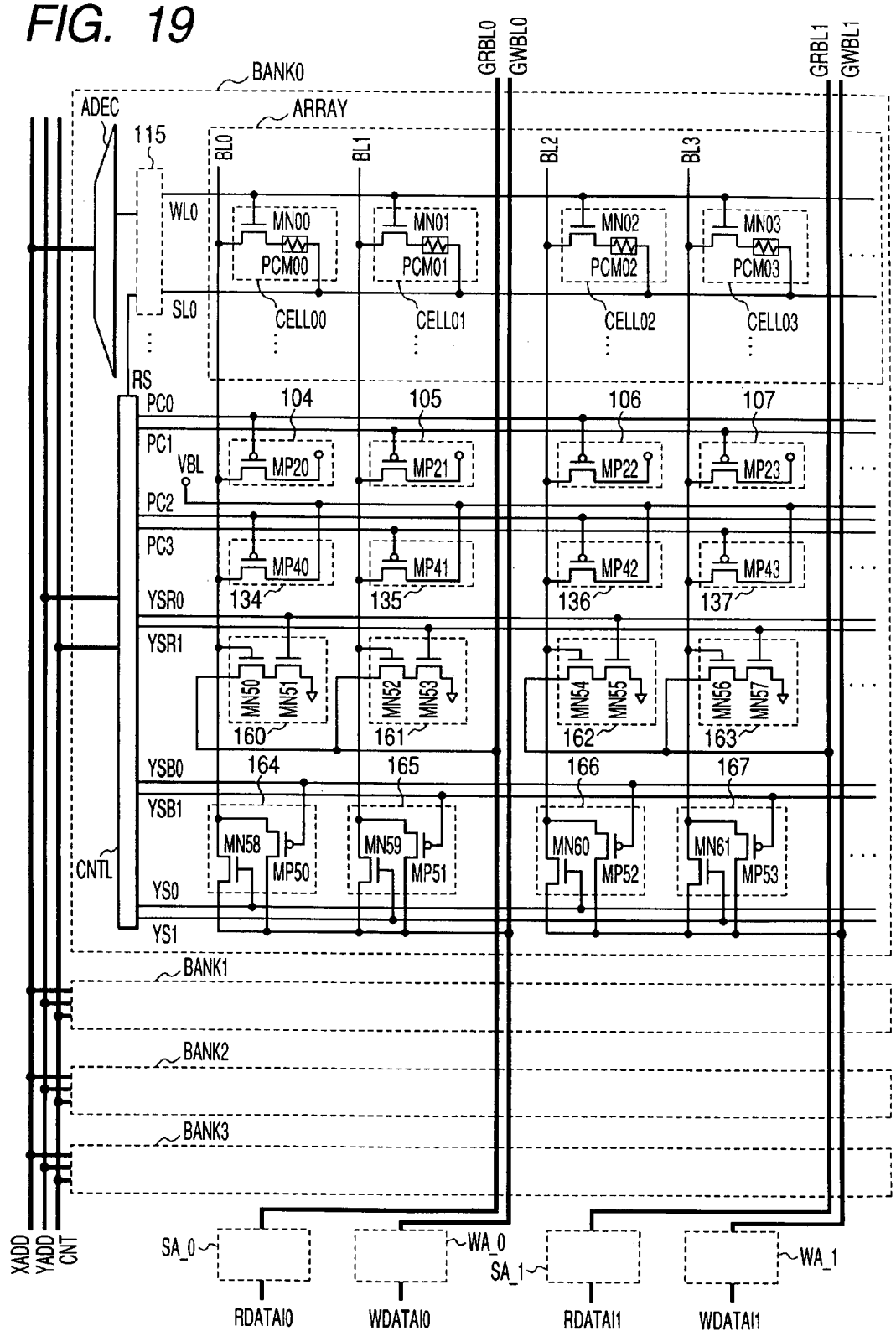
FIG. 19 is a circuitry diagram showing an embodiment of the memory block shown in FIG. 2.

FIG. 19 is a diagram for explaining further embodiment of the memory block 100 shown in FIG. 2. In the case where the phase change element is used in the memory device, at the time the RESET operation is to begin right after the SET operation, and at the completion time of the RESET operation and at the READ operation, the shift time of the bit line or source line is restricted. In particular, at the time the RESET operation is to begin after the SET operation, the device is made amorphous so as to have a low resistance, if the source line SL0 shifts too fast in its state. Thus, the source line SL0 needs to shift in its state over 5 nanoseconds. At the completion time of the RESET operation, the bit line BL0 is controlled to shift quickly from "L" to "H" so that the memory device will not be made amorphous, and the device needs to rapidly be cooled down by a radical drop of the voltage applied thereto. Further, in the READ operation, the bit line is discharged quickly (e.g. in a few nanoseconds), restraining the heat to be generated. As a result, the crystalline structure of the memory device PCM02 does not change, and destruction of data can be prevented. That is, the source line needs to slowly shift in its state, whereas the bit line needs to quickly shift in its state.

The source line needs to be greatly loaded, while the bit line needs to be lightly loaded. Hence, a greater number of memory cells should preferably be connected to one source line than the number of memory cells connected to one bit line.

FIG. 19 is a diagram for explaining a memory block, wherein a greater number of memory cells are connected to one source line than the number of memory cells connected to one bit line. The memory block of FIG. 19 comprises a plurality of memory banks and global bit lines. Each of the plurality of memory banks comprises a plurality of memory arrays ARRAY, precharge circuits, read precharge circuits and Y switches. Each of the plurality of memory arrays ARRAY includes word lines WL, bit lines BL, and memory cells CELL. The global bit lines are connected commonly to the plurality of memory banks BANK. The global bit lines include read global bit lines GRBL and write global bit lines GWBL. The read global bit lines GRBL are connected respectively to read circuits SA, while the write global bit lines GWBL are connected respectively to write circuits WA. The Y switches are provided between the global bit lines and the bit lines of each bank, and are composed of Y switches for reading and Y switches for writing. In each of the Y switches for reading 160, 161, 162 and 163, the source-drain path is connected between the ground potential and the global bit line GRBL0, just in the case of MOS transistors MN50 and MN51, for example. The gate of the MOS transistor MN50 is connected to the bit line BL0, while the gate of the MOS transistor MN51 is connected to the control line YSR0. In this manner, the bit lines are divided in the small unit by using Y switches, thereby lowering the number of memory cells connected of one bit line. In addition, the precharge circuits 104, 105, 106, and 107 for use in the RESET completion time are provided along bit lines of each bank BANK, thereby enabling to quickly activate the bit lines. Further, the bit lines are lightly loaded so as to be discharged quickly in the reading, thereby preventing data destruction. The read circuits SA and the write circuits WA can commonly be provided for the plurality of memory banks BANK, thus reducing the area of the memory block.

In this embodiment, because the bit lines are thus divided, the memory cells connected to such a bit line have small capacitance. The bit lines can be quickly discharged, thereby preventing information destruction. Any other characteristics (e.g. having a low threshold voltage or reversing the current direction across the SET operation and the RESET operation) of the memory block can appropriately be excluded.

(Layout of Word Driver Circuit and Source Driver Circuit)

Figure 20:
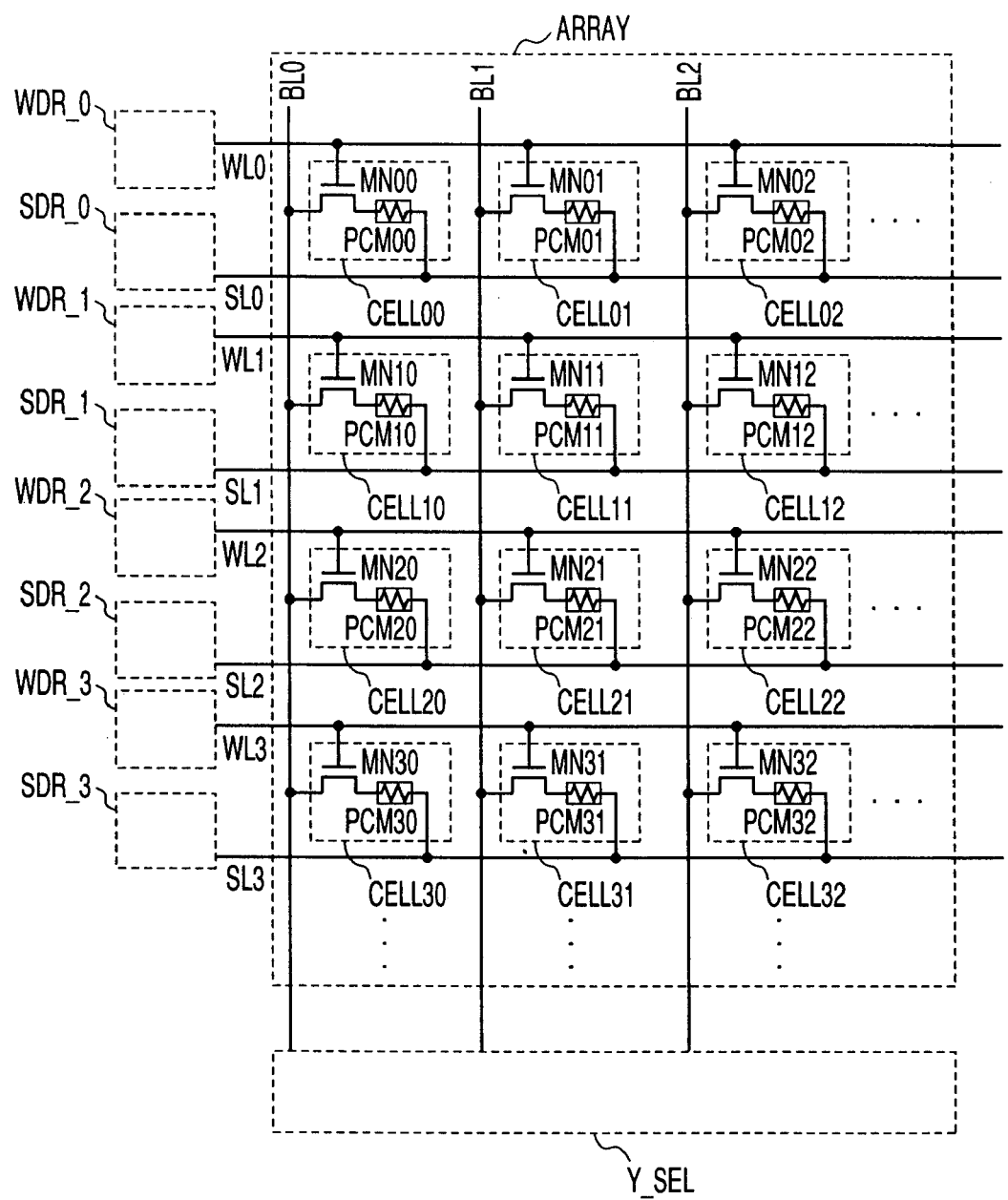
FIG. 20 is a diagram showing the layout of the memory block shown in FIG. 2.
Figure 21:
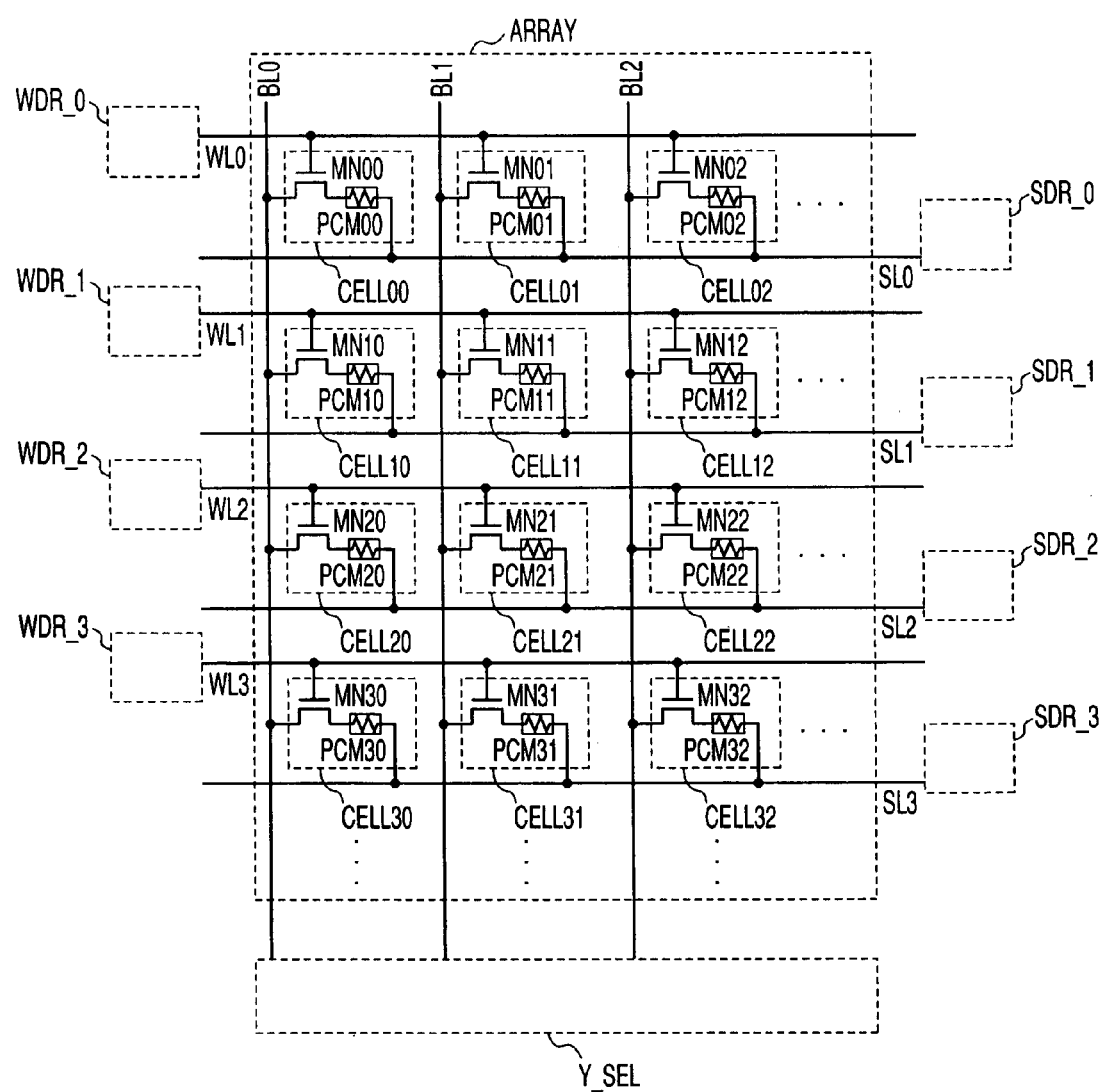
FIG. 21 is a diagram showing the layout of the memory block shown in FIG. 2.
Figure 22:
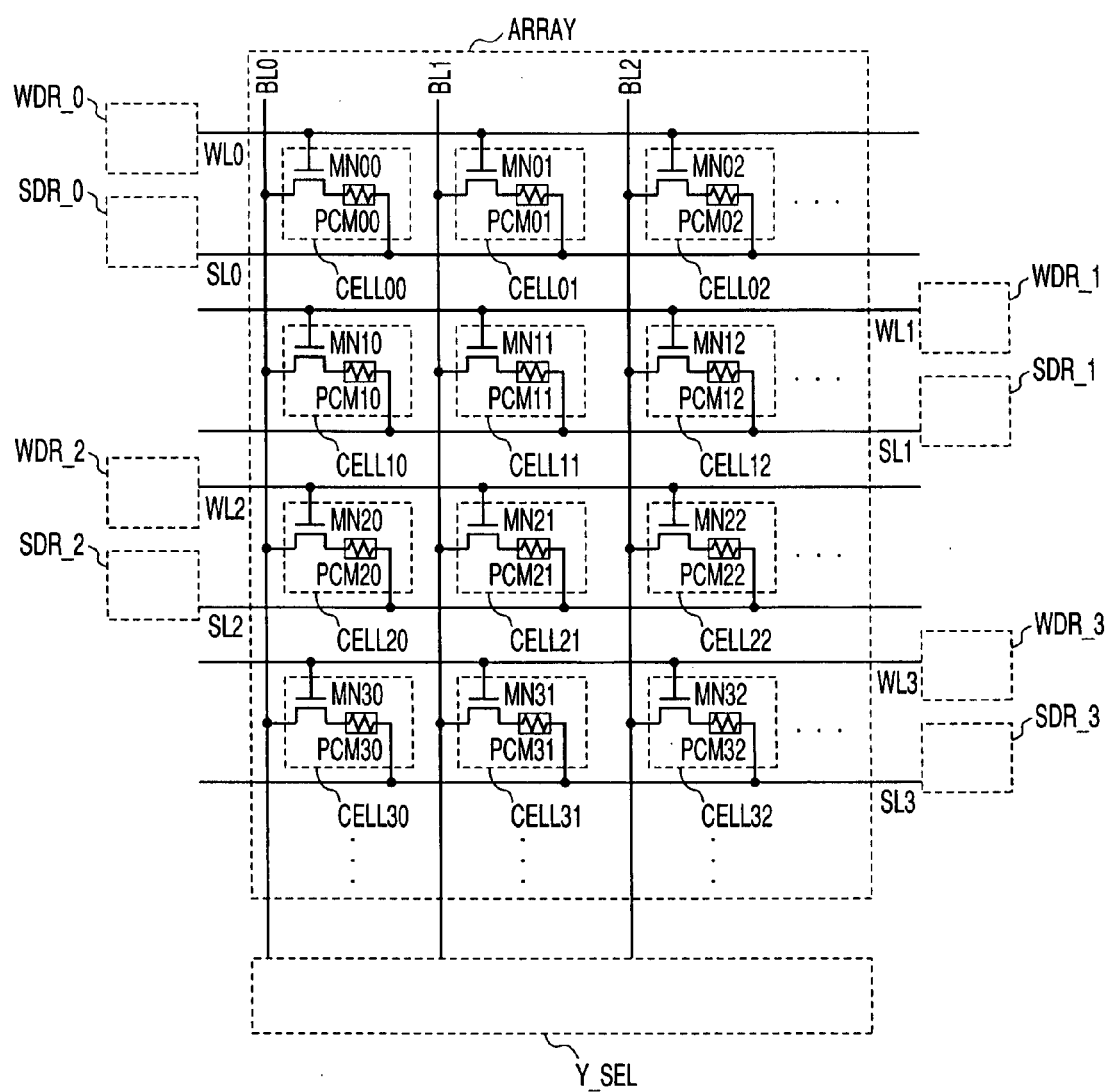
FIG. 22 is a diagram showing the layout of the memory block shown in FIG. 2.

FIG. 20 to FIG. 22 are diagrams for explaining the layout of word driver circuits WDR and source driver circuits SDR. FIG. 20 shows a first example of the layout of the word driver circuits WDR and source driver circuits SDR. The word driver circuits WDR and the source driver circuits SDR are provided along one side of the memory array ARRAY, including the word lines WL, the bit lines BL, and the memory cells. In this arrangement, those circuits are provided in the simple layout, and the size of the memory block can easily be changed. In the illustration, only one memory array ARRAY is shown, however, the word driver circuits WDR and the source driver circuits SDR may be provided between two memory arrays and are commonly connected to both memory arrays. In this configuration, an increased number of memory cells may be connected to one source line. Further, the RESET operation may shift slowly from the SET operation, and wrong write operation can be avoided.

FIG. 21 shows a second example of the layout of the word driver circuits WDR and source driver circuits SDR. In the illustration, the word driver circuits WDR are provided along one side of the memory array including the word lines WL, the bit lines BL, and the memory cells CELL, while the source driver circuits SDR are provided along the facing side of the memory array. In this configuration, the word driver circuits and the source driver circuits are arranged along two rows, thus reducing the area of the memory block.

FIG. 22 shows a third example of the layout of the word driver circuits WDR and source driver circuits SDR. In the illustration, sets of the word driver circuit WDR and the source driver circuit SDR are provided on both sides of the memory array including the word lines WL, the bit lines BL, and the memory cells. In this configuration, the word driver circuits and the source driver circuits are arranged along two rows, thus reducing the area of the memory block. The word driver circuits WDR and the source driver circuits SDR are shared by memory arrays provided on both sides of these circuits, thereby reducing the area of the memory block. Additionally, an increased number of memory cells can be connected to one source line, and the RESET operation can slowly shifts from the SET operation, thus preventing a wrong write operation. Note that the layout of this embodiment can be made in combination with any of the rest of the embodiments.

(Buffering with Internal Memory)

Figure 23:
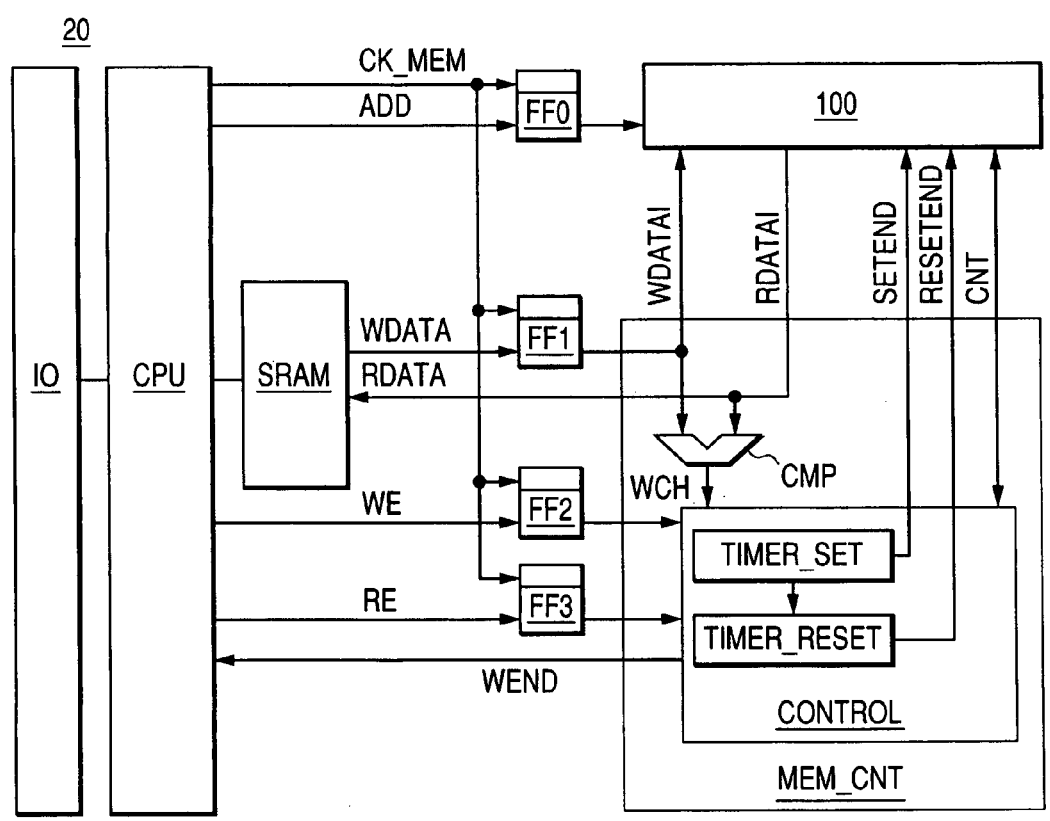
FIG. 23 is a schematic diagram showing the essential part of the microcomputer shown in FIG. 1.

FIG. 23 shows a system LSI (20) according to another embodiment of a system LSI (10) described in embodiment 1. In addition to the system LSI 10 of embodiment 1, a memory SRAM which can be used as a primary cache or on-chip RAM is provided on the silicon substrate. The system LSI (20) can adopt any of the memory blocks 100 according to the above-described embodiments. If the operational frequency of the memory block 100 is lower than that of the CPU, the memory SRAM is used as a buffer. The memory SRAM is thus used as a buffer, the difference in the frequencies can be eliminated, and the CPU can be operated at high speed. In the case where the memory block 100 stores a program to be executed by the CPU, two instructions are transferred to the memory SRAM through one memory access. This eliminates the difference in the operational frequencies.

Figure 24:
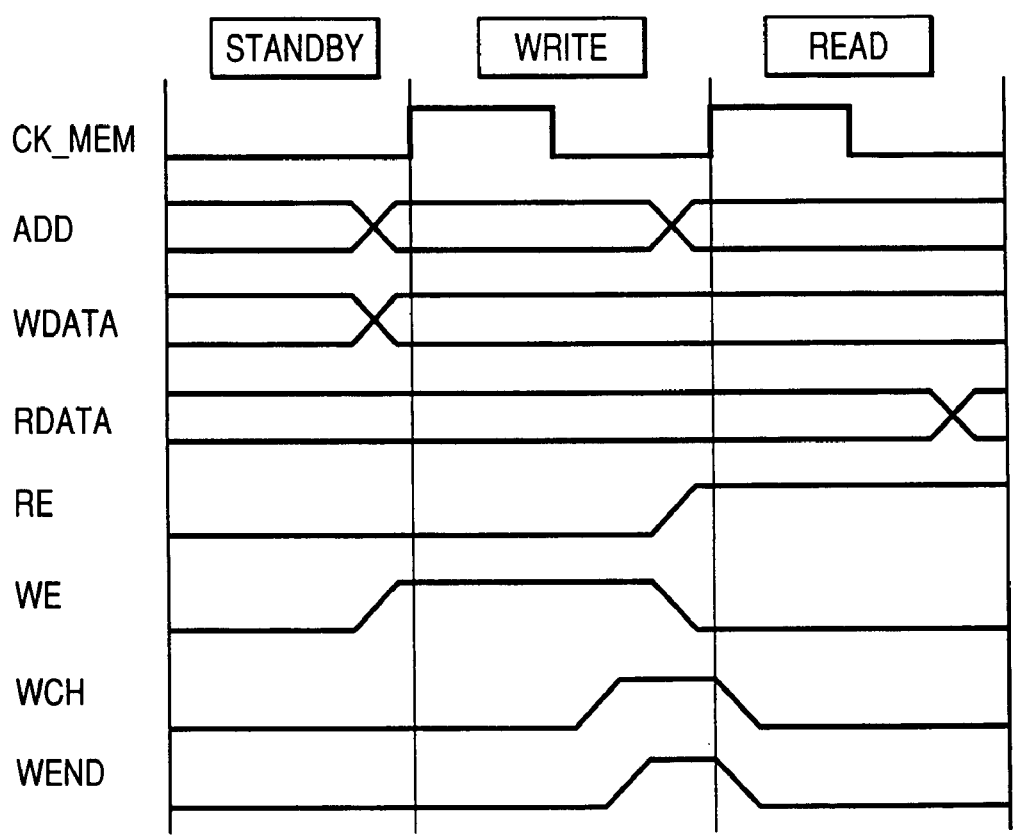
FIG. 24 is an operational waveform diagram for the essential part of the microcomputer shown in FIG. 23.

FIG. 24 is a diagram for explaining operations of the memory block 100. Signals are initially in a STANDBY mode, as shown in the first section of FIG. 24. In the first cycle WRITE, data is written. The CPU sends the address ADD and the write enable signal WE, while the memory SRAM sends the write data WDATA, to their corresponding latch circuits (FF0, FF1, FF2). If the clock CK_MEM for memory shifts from "L" to "H", the address ADD is sent to the memory block 100, while the write data WDATA and the write enable signal WE are sent to the memory controller MEM_CNT. The memory controller MEM_CNT generates the write data WDATAI and the control signal CNT, and sends the generated data to the memory block 100. Upon this transmission, the write operation in the memory block 100 begins. The memory block 100 first executes the SET operation, and the timer circuit TIMER_SET times the SET time. Upon the elapse of a predetermined time period, the SET operation end signal SETEND is sent to the memory block 100, thereby completing the SET operation in the memory block 100. After this, the memory block 100 begins the RESET operation. At the same time, the timer circuit TIMER_RESET begins timing the RESET time. Upon the elapse of a predetermined period, the RESET operation end signal RESETEND is sent to the memory block 100, thereby completing the RESET operation in the block. Then, the VERIFY operation is executed in order to check whether the write operation has satisfactorily been executed, as needed. In the VERIFY operation, the written data is read from the memory block 100. The comparator circuit CMP compares the read data RDATAI with the write data WDATAI. In the case where the read data RDATAI is the same as the write data WDATAI, the comparison result WCH shifts from "L" to "H" and represents that the writing of data has satisfactorily been performed. In the case where the read data RADAI is not the same as the write data WDATAI, the writing is performed again. Upon satisfactory writing of data, the write end signal WEND is sent to the CPU.

In the second cycle READ, the operation for reading data is performed. The CPU sends the address ADD and the read enable signal RE to the latch circuits (FF0, FF3), and the clock CK_MEM for memory shifts from "L" to "H". Upon this, the address ADD is transmitted to the memory block 100, while the read enable signal RE is transmitted to the memory controller MEM_CNT. The memory controller MEM_CNT generates the control signal CNT, and sends the generated signal to the memory block 100. As a result, the READ operation in the memory block 100 begins. The read data RDATAI is sent to the memory SRAM through the memory controller MEM_CNT, thereby completing the READ operation.

(Write Data at High Voltage with Using Thin Film MOS)

Figure 25:
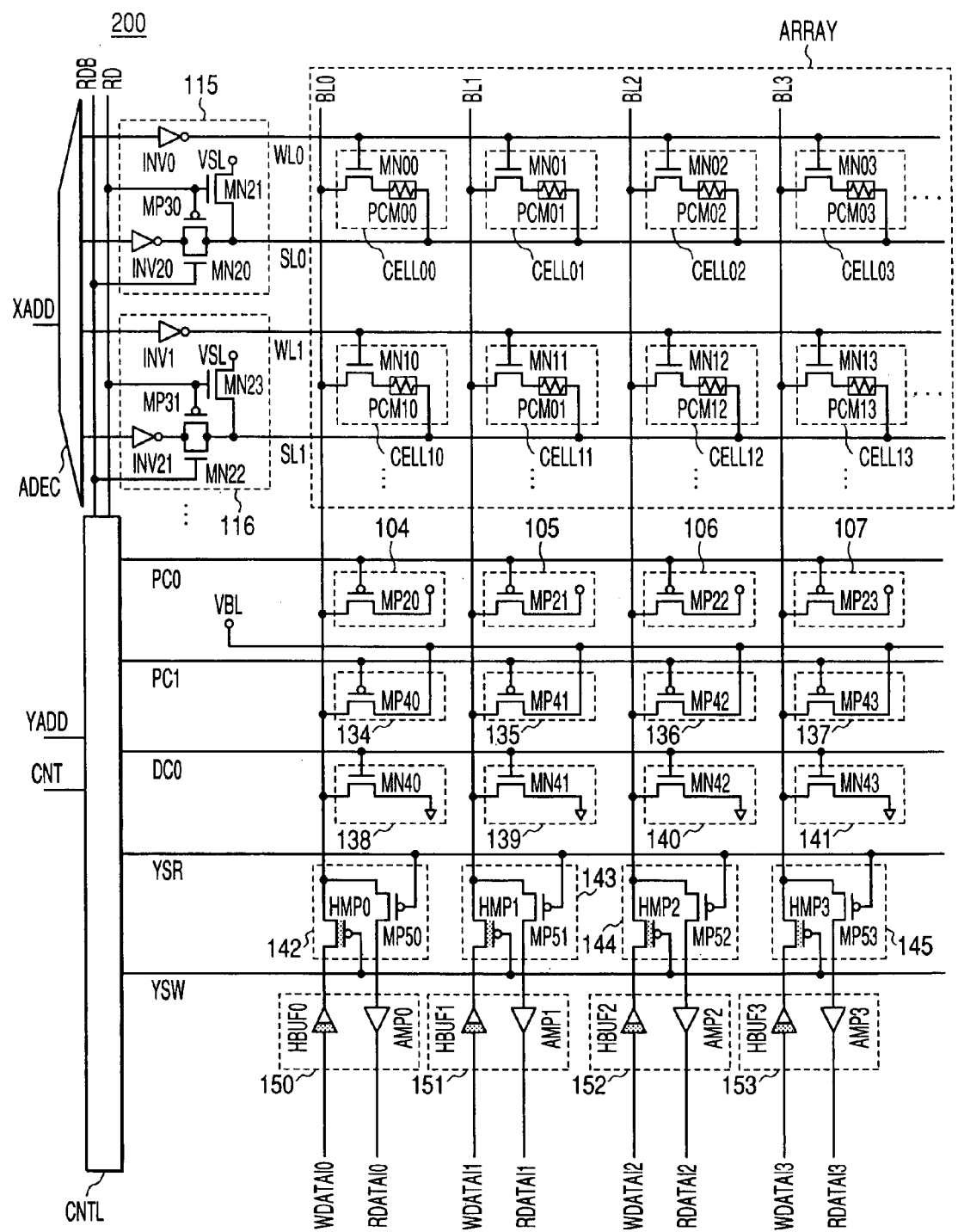
FIG. 25 is a circuitry diagram showing an embodiment of the memory block of FIG. 2.

The thinner the oxide film, the shorter the gate length of the MOS transistor, thereby realizing a small area of the MOS transistor. To have a small size of the memory cells, the cell transistor should preferably have a thin oxide film. In this case, such a thin oxide film is in a thickness of, for example, 3 nm, and a voltage to be applied should be set to 1.2 V in order to ensure the gate withstand voltage. However, a voltage greater (e.g. 2.4 V) than 1.2 V may be necessary for writing data into the device. In this embodiment, FIG. 25 shows the case wherein data writing is performed at a high voltage using thin film MOS transistors. In FIG. 25, what differs mainly from the memory block of FIG. 16 are as follows.

In a memory block 200 according to this embodiment, data are simultaneously written and read into and from all columns, without column selection. The sense amplifier circuits AMP are formed with a simple structure.

In each of the Y switch circuits (142, 143, 144, 145), a Y switch HMP for writing is a MOS transistor having an oxide film thicker than the transistor of the memory cell. In this case, the oxide film is formed in a thickness of 8 nm, for example, thereby a voltage up to 2.4 V can be applied thereto. The oxide film of the MOS transistor may be formed in the same thickness as that of the MOS transistor used in the input/output circuit IO of FIG. 7. The control signal YSW of the Y switch HMP for writing is set to the ground potential in the selected state of the Y switch HMP, and is set to 2.4 V in the non-selected state thereof.

Because a write circuit HBUF outputs a signal at 0 V or 2.4 V, it includes a MOS transistor with a thick oxide film. The rest of the MOS transistors are formed with a thin oxide film.

Word driver circuits (115, 116) have partially a different structure as that of the word driver circuits shown in FIG. 16. For example, the word driver circuit 115 comprises an inverter INV0 activating the word line WL0, an inverter circuit INV20 controlling the source line, N-channel MOS transistors (MN20, MN21), and a P-channel MOS transistor MP30. In this embodiment, the supply lines VSL are set to 0.8 V, and are connected to the source line through the N-channel MOS transistor MN21. The word driver circuits (115, 116) are controlled in accordance with an output of the decoder ADEC and control signals (RDB, RD).

Figure 26:
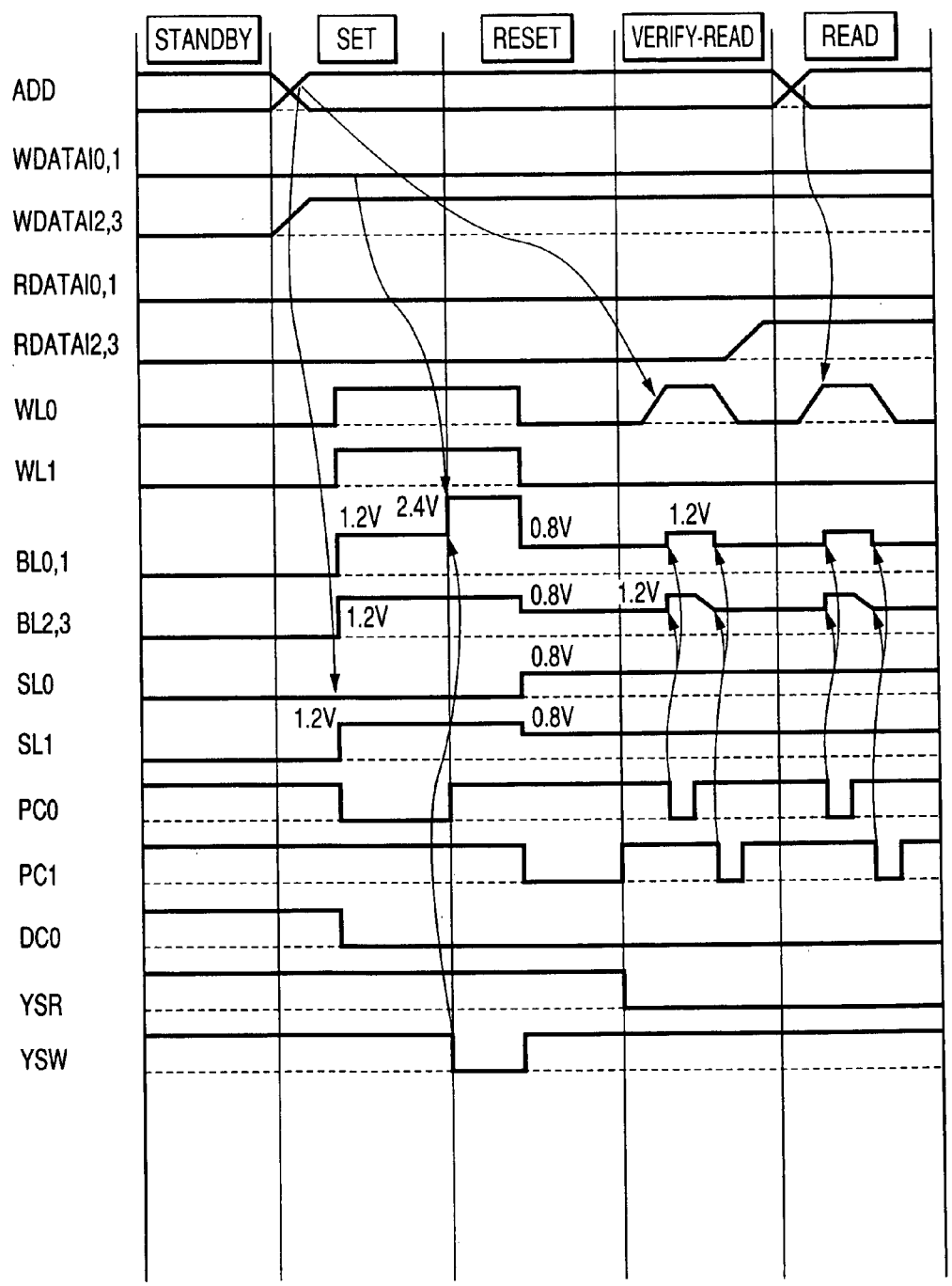
FIG. 26 is an operational waveform diagram for the memory block shown in FIG. 25.

FIG. 26 is a diagram for explaining operations of the memory block 200. In this embodiment, in the write operation, the memory devices (PCM00, PCM01) of the memory cells (CELL00, CELL01) are RESET (defined as "0" writing), while the memory devices (PCM02, PCM03) are SET (defined as "1" writing). Signals are initially in a STANDBY state, as shown in the first section of FIG. 26. In this state, the bit line BL0, the source lines SL, and the word lines WL are all set to 0 V. In the SET operation, all word lines WL are selected and set to 1.2 V. The control signal PC0 shifts from "H" to "L", thereby precharging all bit lines BL to 1.2 V. Of those source lines SL, only the selected source line SL0 is set to 0 V, and a voltage of 1.2 V is applied to the rest of the non-selected source lines (SL1, . . . ). As a result, in all memory cells (CELL00, CELL01, CELL02, CELL03) connected to the word line WL0, the cell transistors (MN00, MN01, MN02, MN03) are ON. In addition, the potential of the bit lines BL is set to 1.2 V, the source lines SL are set to 0 V, and a current flows to the memory devices (PCM00, PCM01, PCM02, PCM03). Then, the memory devices are crystallized, and have a low resistance.

Upon the elapse of a predetermined time, the SET operation is ended, and now the RESET operation begins. In the RESET operation, those bit lines (BL0, BL1) connected to target cells (CELL00, CELL01) for the RESET operation are set to 2.4 V under the control of the write circuits (HBUF0, HBUF1) through the Y switch circuits (142, 143). The transistors (MN00, MN01) of the cells (CELL00, CELL01) are ON, the potential of the bit lines are set to 2.4 V, and the source line SL0 is maintained at 0 V, thereby the memory devices (PCM00, PCM01) turn into a meltdown state. In those memory devices (PCM02, PCM03) for executing the SET operation, the SET operation keeps to be carried out, even if the RESET operation begins.

Upon the elapse of a predetermined time period, the RESET operation begins to be completed. The word lines WL are set to 0 V, and the bit lines BL and the source lines shift to 0.8 V, thereby completing the WRITE operation. The memory devices (PCM00, PCM01), being in the meltdown state, now get cool down, and are made amorphous so as to have a high resistance.

According to the system of the present invention, in the transistor of each memory cell, the voltage between the gate and source and the voltage between the gate and drain are set to a source voltage of 1.2 V or less (less than a withstand voltage). Even if the memory cell is formed with a thin film transistor, a voltage of 2.4 (at maximum) can be applied to the memory devices.

The VERIFY-READ operation, for checking whether the write operation has satisfactorily been performed, and the READ operation will now be described. In this embodiment, only the VERIFY-READ will now be explained, since both operations are the same. First, the word line WL0 shifts from "L" to "H" so as to be active. After that, the precharge control signal PC0 shifts from "H" to "L", thus precharging the bit lines BL to 1.2 V. Upon complete precharging of the bit lines to 1.2 V, the precharge control signal PC0 is inactive, and a current flows from the bit lines (BL0, BL2) to the source lines SL. Because a high resistance value is written in the memory cells (CELL00, CELL01), the bit lines (BL0, BL1) do not almost change in their state, and remain at 1.2 V. Because a low resistance value is written in the memory cells (CELL02, CELL03), the bit lines (BL2, BL3) are precharged, and their potential drops approximately to 0.8 V. After the potential of the bit lines is securely obtained, the sense amplifier circuits AMP amplify data, and output the amplified data as output data RDATAI.

Thereafter, the control signal PC1 shifts from "H" to "L", the data lines are set back to a value (i.e. 0.8 V) of the supply line VBL, and the word lines slowly shift to 0 V. In the system according to the present invention, the bit lines need to be distinguished simply whether they are at 1.2 V or 0.8 V, and the operation for reading data can satisfactorily be accomplished by an ordinary read circuit.

(Prevention of Read Disturb)

In the case where the phase change element is used for the memory device, the device is heated, because a current flows in the read operation. If data is successively read from the same device, the device in the RESET state undesirably turns into the SET. This problem is called a "read disturb" problem. Because a great amount of energy is required for resetting the device being in the SET state, such a read disturb problem may not occur in this device.

Figure 27:
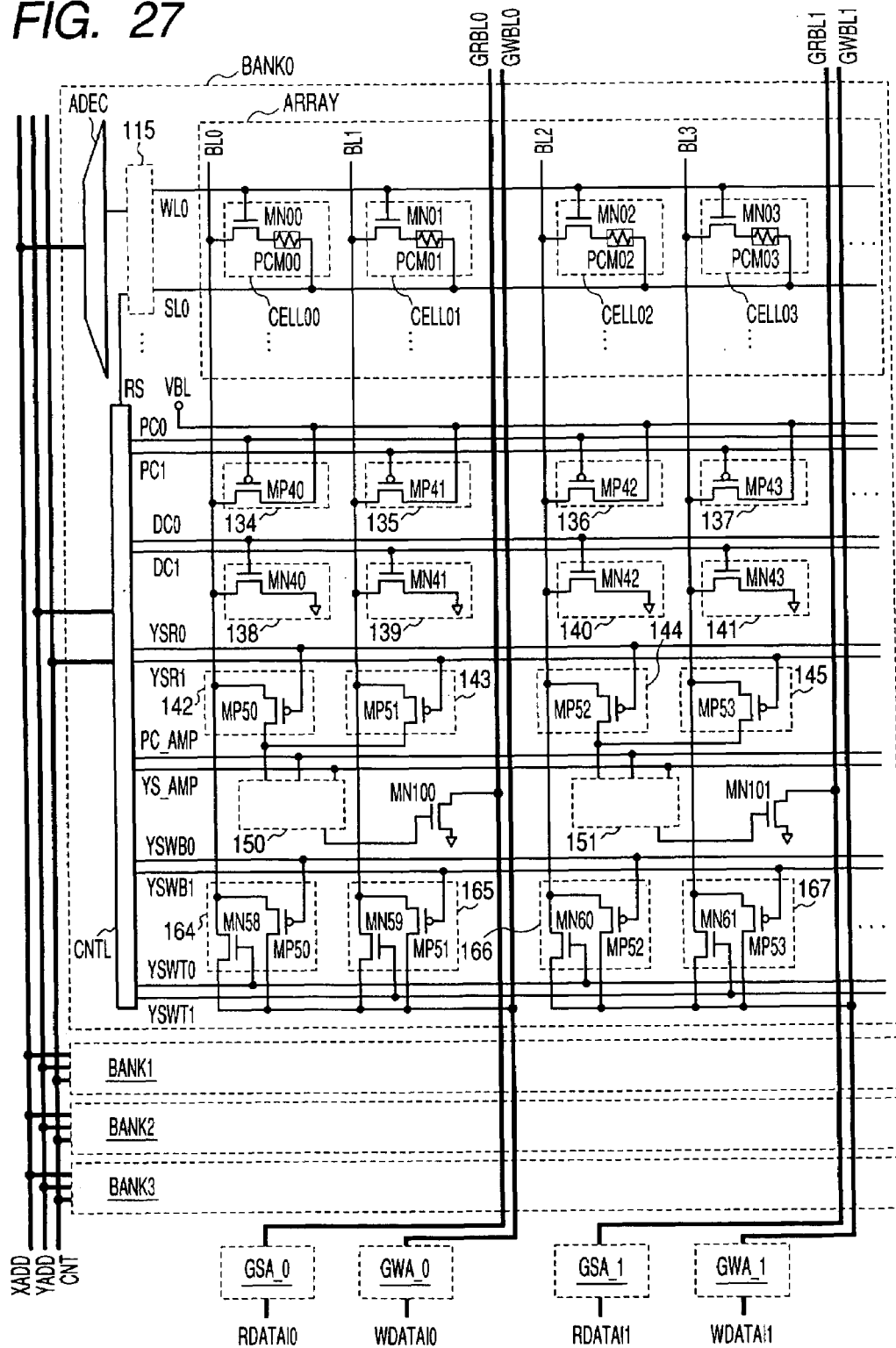
FIG. 27 is a circuitry diagram showing an embodiment of the memory block shown in FIG. 2.

FIG. 27 shows a memory block having a circuitry structure for preventing the read disturb. What differs mainly from the memory block of FIG. 19 are as follows. In the memory block of FIG. 27, each memory bank BANK includes the memory arrays ARRAY, the decoder circuit ADEC, the word driver circuit 115, the control circuit CNTL, the precharge circuits (134, 135, 136, 137), the discharge circuits (138, 139, 140, 141), the Y switch circuits (142, 143, 144, 145) for READ, the read circuits (150, 151), N-channel MOS transistors (MN100, MN101) for activating the read global bit lines GRBL and Y switch circuits (164, 165, 166, 167) for WRITE.

The read global bit lines GRBL are connected to global read circuits GSA and the N-channel MOS transistors (MN100, MN101) of each memory bank BANK. The write global bit lines GWBL are connected to global write circuits GWA and the Y switch circuits for WRITE (164, 164, 166, 167) of each memory bank BANK.

Each of the Y switches (142, 143, 144, 145) for READ includes a P-channel MOS transistor MP, and selectively connects its corresponding bit line BL to the read circuits (150, 151).

The read circuits (150, 151) have the same structure as that of the read circuits (150, 151) shown in FIG. 5. An output of the read circuits (150, 151) is coupled to the gate electrode of the N-channel MOS transistors (MN100, MN101).

Figure 28:
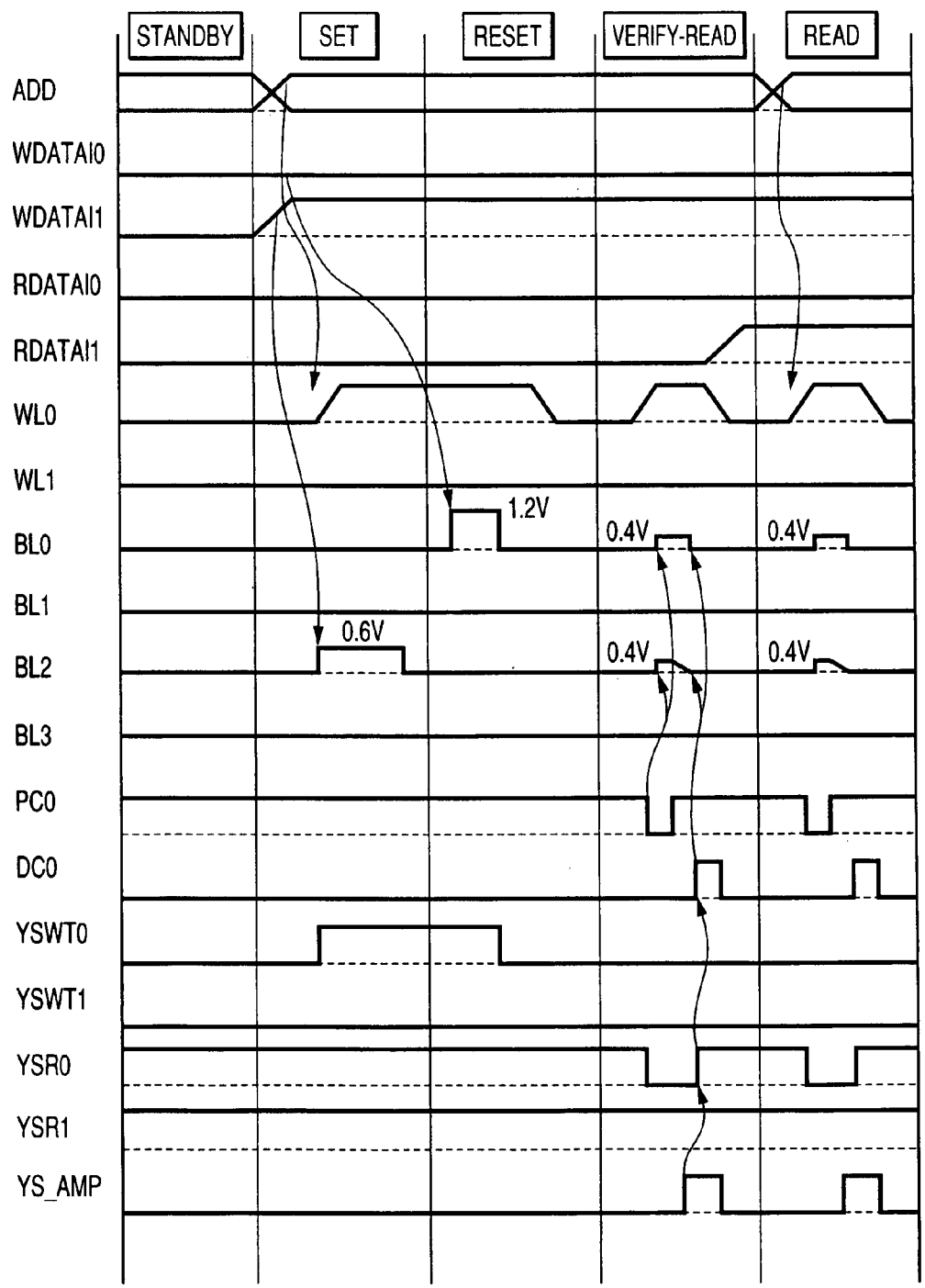
FIG. 28 is an operational waveform diagram of the memory block shown in FIG. 27.

FIG. 28 is a diagram for explaining operations of the memory block according to the present invention. In this embodiment, the source lines SL are connected to the ground potential. In the SET operation, the word line WL0 is selected, the bit line BL2 is controlled to 0.6 V by the global write circuit GWA_1 through the Y switch circuit 166, and the memory device PCM02 is now SET. In the RESET operation, the word line WL0 is selected, the bit line BL0 is controlled to 1.2 V by the global write circuit GWA_0 through the Y switch 164, and the memory device PCM00 is RESET.

The VERIFY-READ operation will now be described. After the word line WL0 is selected so as to be "H" from "L", the precharge control signal PC0 shifts from "H" to "L", and the bit lines (BL0, BL2) are precharged to the potential of the supply line VBL (i.e. from 0 V to 0.4 V). Upon the complete precharge, the control signal PC0 shifts from "L" to "H", the precharge signal is inactive, thereby the bit lines are in a floating state. After this, a current flows from the bit lines BL to the source line SL0, and the potential of the bit lines BL changes.

Because a high resistance value is written in the memory cell CELL00, the bit line BL0 does not change in its state. Because a low resistance value is written in the memory cell CELL02, the bit line BL2 is discharged. The potential change of the bit lines BL is transmitted respectively to the read circuits (150, 151) by the Y switch circuits (142, 144). The transmitted data is amplified in accordance with the control signal YS_AMP, and maintained in the read circuits.

This data is sent to the read global bit lines GRBL by the N-channel MOS transistors (MN100, MN101), amplified by the global read circuits GSA, and outputs as the read data (RDATAI0, RDATAI1). At the same time the read data is maintained in the read circuits (150, 151), the control signal YSR0 shifts from "L" to "H", thereby disconnecting the bit liens BL from the read circuits (150, 151), and the control signal DC0 shifts from "L" to "H", thereby discharging the bit lines BL to 0 V. After that, the word lines shift from "H" to "L" so as to be inactive, thus completing the VERIFY-READ operation. Note that the READ operation is the same as the VERIFY-READ operation.

In the system according to the present invention, after the word lines WL are ON, the bit lines BL are precharged, and the data is read. After that, sequentially, the bit lines BL are discharged, and the word lines WL are OFF. Generally, because the word lines WL are greatly loaded, it takes time to shift in their state. On the other hand, because the bit lines are generally lightly loaded and can shift quickly. Thus, after the word lines WL are ON, the bit lines BL are precharged, and after the bit lines BL are discharged, the word lines WL are OFF. In such sequential processing, a voltage can be applied to the memory devices in a minimum period of time. Further, according to the system of this embodiment, the bit lines are divided in each bank BANK and arranged in hierarchy. In this configuration, the bit lines BL can further lightly be loaded and can shift at high speed. Because the bit lines BL are arranged in hierarchy, and the read circuits are provided for each memory bank BANK, the READ operation itself can be executed at high speed. As a result, the voltage can be applied to the memory devices in a short period of time.

In this manner, the voltage is applied to the memory devices in a short period of time, thereby restraining heat to be generated in the memory devices and preventing the read disturb of the memory devices. In the write operation, there is no need for the voltage to be applied to the devices in a short time, the write circuit is not necessarily provided for each memory bank BANK, thus only the write circuit needs to globally be provided. This can prevent an increase in the area of the memory block.

((2) Write Data at High Voltage with Thin Film MOS)

Figure 30:
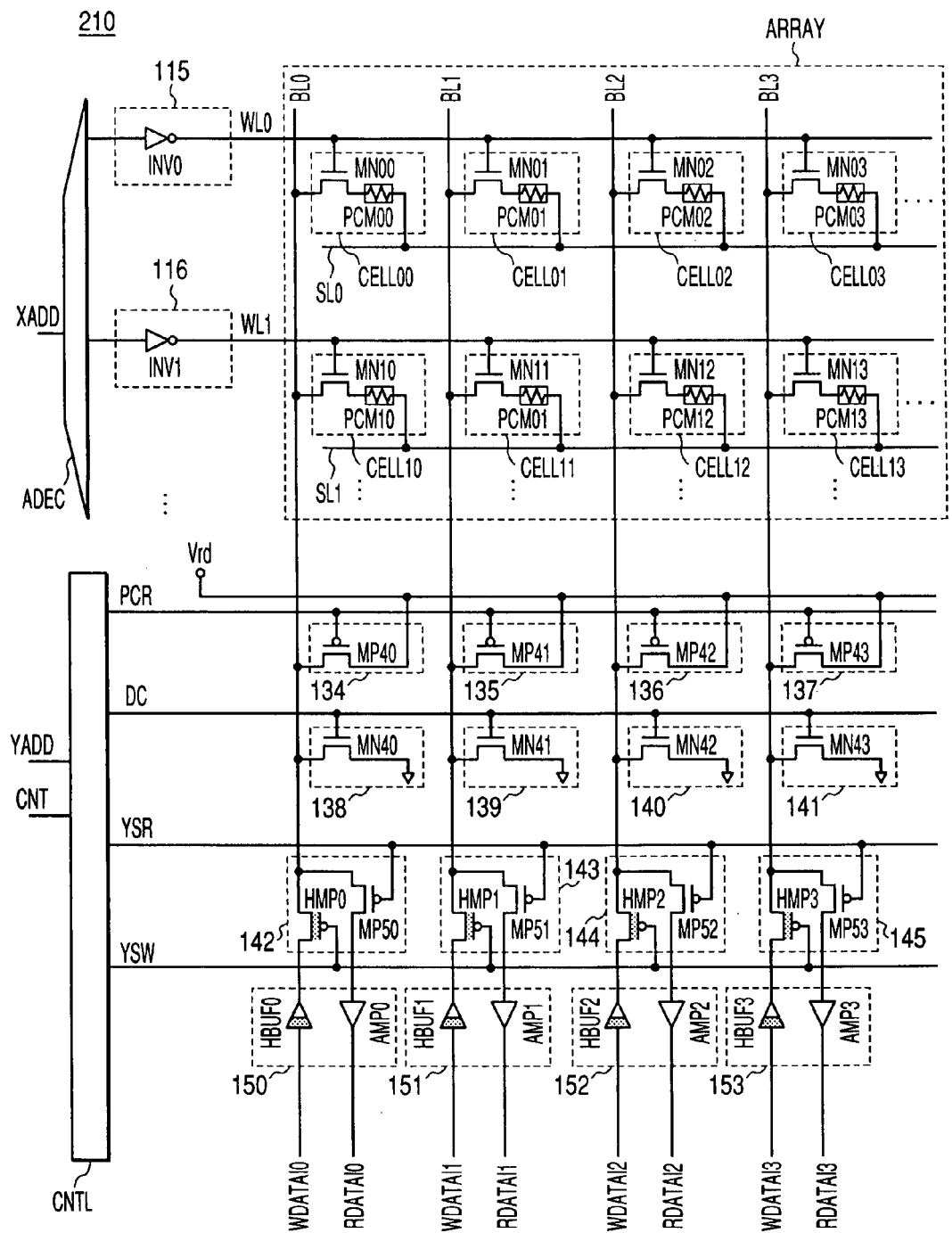
FIG. 30 is a circuitry diagram showing an embodiment of the memory block shown in FIG. 2.

Even with the thin film MOS transistor, a voltage of or greater than a withstand voltage can be applied to the MOS transistor only within a restricted time. FIG. 30 is a diagram for explaining the write operation to be carried out at a high voltage using thin film MOS transistors, based on such a characteristic of the thin film MOS transistors. What mainly differs from the memory block of FIG. 25 are as follows.

In a memory block 210 according to this embodiment, the source lines SL are not controlled, but simply connected to the ground potential. The precharge circuits are precharged only to a reading potential Vrd, and those circuits to be precharged to a supply potential are excluded. 1024 memory cells are connected to each of the bit lines. The oxide film of the thin film MOS transistors in this embodiment is formed in a thickness of 4 nm, and normally a voltage of 1.5 can be applied thereto.

Figure 31:
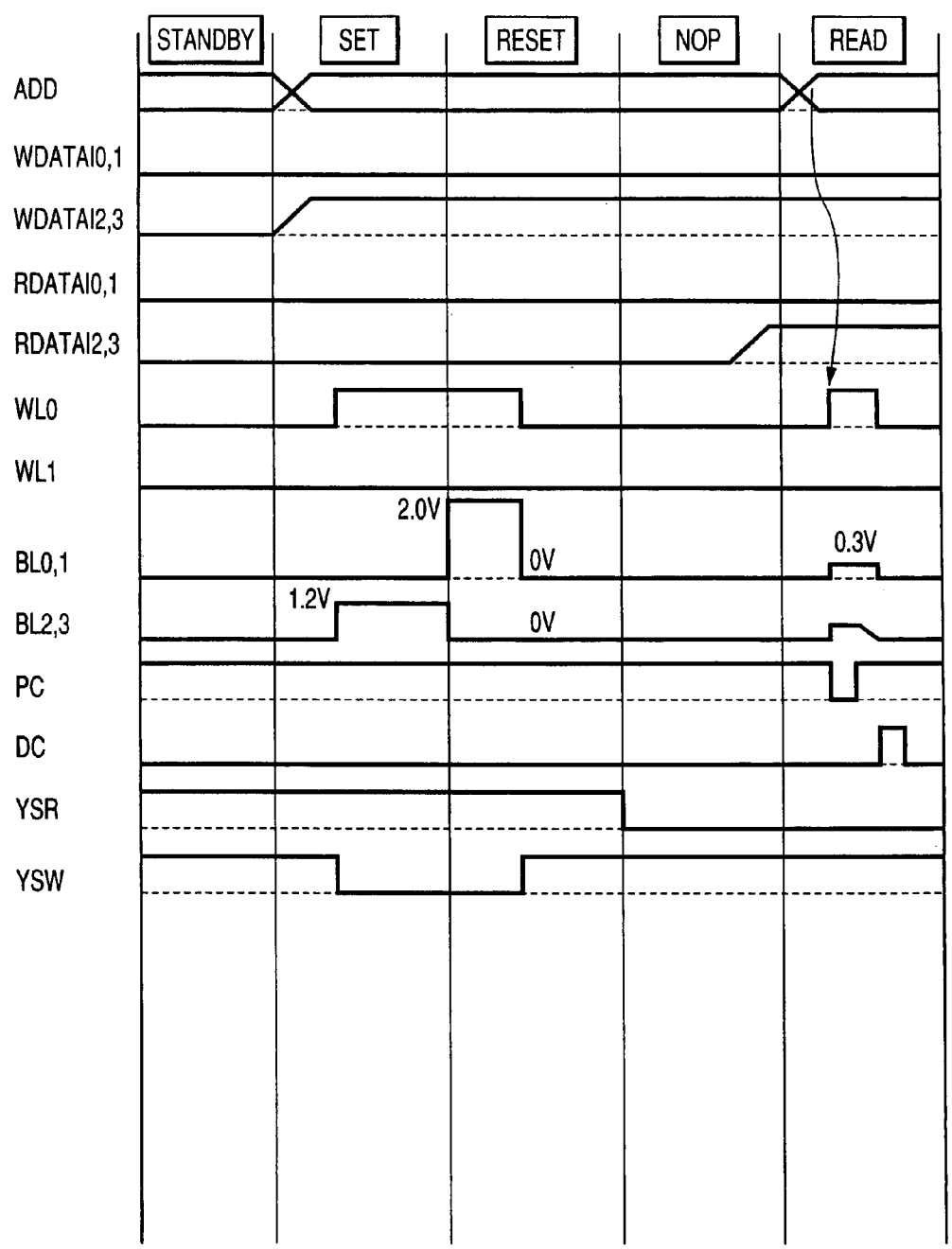
FIG. 31 is an operational waveform diagram for the memory block shown in FIG. 29.

FIG. 31 is a diagram for explaining operations of the memory block according to this embodiment. In this embodiment, in the write operation, the memory devices (PCM00, PCM01) of the respective memory cells (CELL00, CELL01) are RESET (defined as "0" writing), while the memory devices (PCM02, PCM03) are SET (defined as "1" writing). Signals are initially in a STANDBY mode, as shown in the first section of FIG. 31. In this case, the bit lines BL, the source lines SL, and the word lines WL are all set to 0 V. In the SET operation, the word line WL0 is selected and set to 1.5 V. The bit lines (BL2, BL3) are set to a SET voltage of 1.2 V by the write circuits (HBUF2, HBUF) through the Y switch circuits (144, 145). As a result, in the memory cells (CELL02, CELL03) connected to the word line WL0, the cell transistors (MN02, MN03) are ON. In addition, the potential of the bit lines BL is set to 1.2 V, the source lines SL are set to 0 V, and a current flows to the memory devices (PCM02, PCM03). Then, the memory devices are crystallized, and have a low resistance.

Upon the elapse of a predetermined time period, the bit lines (BL2, BL3) are set to 0 V, completing the SET operation. After this, the RESET operation begins. In the RESET operation, those bit lines (BL0, BL1) connected to target memory cells (CELL00, CELL01) for the RESET operation are set to 2.0 V by the write circuits (HBUF0, HBUF1) through the Y switch circuits (142, 143). The transistors (MN00, MN01) of the cells (CELL00, CELL01) are ON, the potential of the bit lines are set to 2.0 V, the source line SL0 is maintained at 0 V, a current flows to the memory devices (PCM00, PCM01), thereby the memory devices turn into a meltdown state.

Upon the elapse of a predetermined time period, the word line WL0 and the bit lines (BL0, BL1) shift to 0 V, and the RESET operation is ended. The memory devices (PCM00, PCM01), being in a meltdown state, now get cool down, and are made amorphous so as to have a high resistance value.

The memory cell in an on-chip ROM is requested to execute the WRITE operation approximately one million times. In the case where the RESET operation is performed in 100 ns, the total write time in one cell is 0.1 s. In the transistors MN of the memory cells that do not perform the writing operation through the same bit line, a voltage (2 V) of or greater than a withstand voltage is similarly applied between the gate and drain electrodes. In this embodiment, 1024 memory cells are connected to each of the bit lines BL. In the case where writing is performed one million times in all memory cells, a voltage of 2 V is to be applied between the gate and source of the MOS transistors approximately for 100 s. In this embodiment, a voltage up to 1.5 V can be applied to the thin film MOS transistors. The product reliability can be ensured, only if a voltage up to 2 V is applied thereto within 100 s. As described above, writing can be achieved in the memory devices at a voltage of or greater than a withstand voltage, even the thin film MOS transistors are used.

After the write operation, good reading can not be achieved, until the memory devices get cool down and have a low resistance value. Therefore, the VERIFY operation (for checking whether the write operation has satisfactorily been performed after a while) or an ordinary READ operation is executed. First, the word line WL0 is set to "H" from "L" so as to be active. After that, the precharge control signals PC shift from "H" to "L" so as to precharge the bit lines BL to 0.3 V. Upon the complete change, the precharge control signals PC are inactive, and a current flows form the bit lines (BL0, BL1, BL2, BL3) to the source lines SL. Because a high resistance value is written into the memory cells (CELL00, CELL01), the bit lines (BL0, BL1) do not almost change in their state and maintain at 0.3 V. On the other hand, because a low resistance value is written into the memory cells (CELL02, CELL03), the bit lines (BL2, BL3) are discharged, and their potential drops approximately to 0 V. After the potential of the bit lines is securely obtained, the sense amplifier circuits AMP amplifies data, and outputs the amplified data as data RDATAI.

After that, the control signal DC is set from "L" to "H", the data lines are set back to 0 V, the word lines shift to 0 V, thus completing the READ operation.

What is claimed is:

1. A semiconductor device comprising a memory block and an input/output circuit, wherein:
   said memory block includes
   a memory array including a plurality of word lines,
   a plurality of bit lines crossing said plurality of word lines, and
   a plurality of memory cells provided at respective intersections of said plurality of word lines and said plurality of bit lines; and
   each of said plurality of memory cells includes
   a MOS transistor,
   a memory device,
   a first node connected to a corresponding one of said plurality of word lines and a gate of said MOS transistor,
   a second and third nodes between which a source-drain path of said MOS transistor and said memory device are connected, and said memory device being connected to said third node; and
   in a case where first information is written into said memory device, a current flows from said second node to said third node, and in a case where second information is written into said memory device, a current flows from said third node to said second node.

2. The semiconductor device according to claim 1, wherein:
   said memory array further includes a plurality of source lines crossing said plurality of bit lines;
   said second node is connected to a corresponding one of said plurality of bit lines;
   said third node is connected to a corresponding one of said plurality of source lines; and
   said semiconductor device further includes a plurality of source driver circuits corresponding to each of said plurality of source lines.

3. The semiconductor device according to claim 2, wherein:
   each of said plurality of source driver circuits includes a precharge circuit for supplying a first potential to a corresponding one of said plurality of source lines; and
   one of said plurality of source driver circuits which is connected to a target memory cell for a read operation activates a corresponding source line at a second potential lower than said first potential, in the read operation.

4. The semiconductor device according to claim 2, wherein
   a potential of a target one of said plurality of bit lines for a write operation is changed, in a case where said first information is written into a corresponding one of said plurality of memory cells, and a potential of a corresponding one of said plurality of source lines which is connected to a target memory cell for the write operation for writing said first information is changed, in a case where to complete the write operation.

5. The semiconductor device according to claim 4, wherein
   after said first information is written into said corresponding one of said plurality of memory cells, in a case where to write said second information, a potential of at least one of said plurality of bit lines other than at least one bit line connected to a target memory cell for a write operation for writing said second information is changed, and in a case where to complete the write operation, a potential of said at least one bit line connected to said target memory cell for the write operation for writing said second information is changed.

6. The semiconductor device according to claim 1, wherein
   a voltage is applied to said memory device in a case where to write said first information, for a period of time longer than a period of time in which a voltage is applied to said memory device in a case where to write said second information, and
   a voltage is applied to said memory device in a case where to read information written thereinto, for a period of time shorter than a period of time in which a voltage is applied to said memory device in a case where to write said second information.

7. The semiconductor device according to claim 1, wherein said memory cells connected to each of said plurality of bit lines includes one hundred twenty eight memory cells.

8. A semiconductor device comprising:
   a memory array including a plurality of word lines, a plurality of bit lines crossing said plurality of word lines, and a plurality of memory cells provided at respective intersections of said plurality of word lines and said plurality of word lines;
   a plurality of word driver circuits which are connected to said plurality of word lines, wherein
   each of said plurality of memory cells includes a MOS transistor, a memory device, a first node connected to a corresponding one of said plurality of word lines, a second node connected to a corresponding one of said plurality of bit lines, and a third node,
   said first node is connected to a gate of said MOS transistor, and a source-drain path of said transistor and said memory device are connected between said second node and said third node,
   said memory device has a resistance value which changes in accordance with a difference of currents flowing thereto, and
   each of said plurality of word driver circuits supplies a negative voltage, in a case where a corresponding one of said plurality of word lines is not selected.

9. The semiconductor device according to claim 8, wherein
   said memory device is a phase change element.

10. A semiconductor device, comprising:
    a plurality of main bit lines;
    a first memory array which includes a plurality of first word lines, a plurality of first bit lines crossing said plurality of word lines, and a plurality of first memory cells provided at respective intersections of said plurality of first word lines and said plurality of first bit lines;
    a second memory array which includes a plurality of second word lines, a plurality of second bit lines crossing said plurality of second word lines, and a plurality of second memory cells provided at respective intersections of said plurality of second word lines and said plurality of second bit lines;
    a first selection circuit which connects said plurality of main bit lines correspondingly to said plurality of first bit lines;
    a second selection circuit which connects said plurality of main bit lines correspondingly to said plurality of second bit lines;

a plurality of first precharge circuits which correspond to each of said plurality of first bit lines;

a plurality of second precharge circuits which correspond to each of said plurality of second bit lines; and an amplifier which is connected to said plurality of main bit lines, wherein each of said plurality of memory cells includes a MOS transistor, a memory device, a first node connected to a corresponding one of said plurality of word lines, a second node connected to a corresponding one of said plurality of bit lines, and a third node connected to a corresponding one of a plurality of source lines, and said memory device has a resistance value which changes in accordance with a difference of currents flowing thereto, wherein said first memory array further includes a plurality of first source lines crossing said plurality of first bit lines and connected to said third node of a corresponding one of said plurality of first memory cells, and a plurality of source drivers corresponding to each of said plurality of first source lines, and said second memory array further includes a plurality of second source lines crossing said plurality of second bit lines and connected to said third node of a corresponding one of said plurality of second memory cells, and a plurality of source drivers corresponding to each of said plurality of first source lines, and wherein after first information is written into a corresponding one of said plurality of first memory cells, a potential of a target one of said plurality of bit lines for a write operation is changed, and to complete the write operation, a potential of a corresponding one of said plurality of source lines which is connected to a target memory cell for the write operation is changed.

11. The semiconductor device according to claim 10, wherein after said first information is written into said corresponding one of said plurality of first memory cells, in a case where to write second information, a potential of at least one of said plurality of bit lines other than at least one bit line connected to a target memory cell for a write operation for writing said second information is changed, and in a case where to complete the write operation, a potential of said at least one bit line connected to said target memory cell for the write operation for writing said second information is changed.

12. The semiconductor device according to claim 11, wherein a direction of a current flowing to said second node and said third node is changed across the write operation for writing said first information and the write operation for writing said second information.

* * * * *